United States Patent
Tobise et al.

(10) Patent No.: US 7,663,309 B2
(45) Date of Patent: Feb. 16, 2010

(54) ORGANIC ELECTROLUMINESCENT ELEMENT HAVING PLURALITY OF LIGHT EMITTING LAYERS WITH SPECIFIC THICKNESSES

(75) Inventors: Manabu Tobise, Kanagawa (JP); Masaru Kinoshita, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 303 days.

(21) Appl. No.: 11/902,899

(22) Filed: Sep. 26, 2007

(65) Prior Publication Data
US 2008/0093988 A1   Apr. 24, 2008

(30) Foreign Application Priority Data
Sep. 28, 2006   (JP)   ............... 2006-264840

(51) Int. Cl.
*H01L 51/00* (2006.01)
*H05B 33/02* (2006.01)

(52) U.S. Cl. .................. 313/506; 313/504
(58) Field of Classification Search .......... 313/504, 313/506
See application file for complete search history.

(56) References Cited

U.S. PATENT DOCUMENTS

2006/0279203 A1*  12/2006  Forrest et al. ............... 313/504
2007/0035243 A1*   2/2007  Lee ............................. 313/506
2007/0099026 A1*   5/2007  Lee et al. ..................... 428/690
2007/0159088 A1*   7/2007  Sakamoto .................... 313/506
2007/0241676 A1*  10/2007  Park et al. .................... 313/506

FOREIGN PATENT DOCUMENTS

| JP | 6-310275 A   | 11/1994 |
| JP | 8-162273 A   | 6/1996  |
| JP | 2003-45676 A | 2/2003  |
| JP | 2003-123984 A| 4/2003  |

OTHER PUBLICATIONS

Sung Soo Lee et al., White light emission obtained by direct color mixing in multi-layer organic light-emitting Devices, Jan. 25, 2002, Korean J. Chem. Eng., 19(3) 463-466.*
Kido, J. et al.; Science, vol. 267, No. 3, pp. 1332-1334 (1995).

* cited by examiner

*Primary Examiner*—Karabi Guharay
(74) *Attorney, Agent, or Firm*—Birch, Stewart, Kolasch & Birch, LLP

(57) ABSTRACT

In an organic EL element, a light-emitting layer is divided into at least three layers in a thickness direction including a light-emitting layer A close to an anode, a light-emitting layer C close to a cathode and a light-emitting layer B between the light-emitting layers A and C, wherein in one embodiment a thickness (a) of the light-emitting layer A, a thickness (c) of the light-emitting layer C and a thickness (b) of the light-emitting layer B satisfy the relationship of a<b<c, and an intermediate layer containing an electron blocking material is disposed between the divided light-emitting layers; and in another embodiment, the relationship of a>b>c is satisfied, and an intermediate layer containing a hole blocking material is disposed between the divided light-emitting layers.

12 Claims, 2 Drawing Sheets under 35 USC 119 from
ORGANIC ELECTROLUMINESCENT ELEMENT HAVING PLURALITY OF LIGHT EMITTING LAYERS WITH SPECIFIC THICKNESSES

CROSS-REFERENCE TO RELATED APPLICATION

This application claims priority under 35 USC 119 from Japanese Patent Application No. 2006-264,840, the disclosure of which is incorporated by reference herein.

BACKGROUND OF THE INVENTION

1. Field of the Invention

The present invention relates to a light emitting device which has improved external quantum efficiency, and in particular, to a light emitting device which can be effectively applied to a surface light source for a full color display, a backlight, an illumination light source or the like; or a light source array for a printer or the like.

2. Description of the Related Art

An organic light emitting device (hereinafter, referred to as an "organic EL device" in some cases) is composed of a light-emitting layer or a plurality of functional layers containing a light-emitting layer, and a pair of electrodes sandwiching these layers. The organic EL device is a device for obtaining luminescence by utilizing at least either one of luminescence from excitons each of which is obtained by recombining an electron injected from a cathode with a hole injected from an anode to produce the exciton, or luminescence from excitons of other molecules produced by energy transmission from the above-described excitons.

Heretofore, a light emitting device has been developed by using a laminate structure from integrated layers in which each layer is functionally differentiated, whereby brightness and device efficiency are remarkably improved. For example, it is described in "Science", vol. 267, No. 3, page 1332, (1995) that a two-layer laminated type device obtained by laminating a hole transport layer and a light-emitting layer also functioning as an electron transport layer; a three-layer laminated type device obtained by laminating a hole transport layer, a light-emitting layer, and an electron transport layer; and a four-layer laminated type device obtained by laminating a hole transport layer, a light-emitting layer, a hole blocking layer, and an electron transport layer have been frequently used.

However, many problems still remain for putting light emitting devices to practical use. First, there is a need to attain a high external quantum efficiency, and second, there is a need to attain a high driving durability. Particularly, deterioration of quality during continuous driving is one of the most prominent problems.

For example, there has been disclosed in JP-A No. 2003-123984 an attempt to dispose an interface layer of 0.1 nm to 5 nm as a barrier layer between a light-emitting layer and a hole transport layer and retard the migration of holes, to thereby control the migration balance between holes and electrons and enhance the external quantum efficiency. However, this means potentially involves a problem of lowering the brightness and increasing the driving voltage since the migration of all of the carriers is lowered, as well as a problem of lowering the driving durability, since the time that the carriers stay in the device is made longer.

Further, a configuration in which light emitting units each containing a light-emitting layer and a functional layer are stacked in a multi-layer structure is known. For example, JP-A No. 6-310275 discloses a configuration in which plural light emitting units including an organic electroluminescence device are isolated by an insulation layer, and opposing electrodes are provided for each of the light emitting units. However, in this configuration, since the insulation layer and the electrode between the light emitting units hinder the taking out of light emission, light emitted from each of the light emitting units cannot substantially be utilized sufficiently. Further, this is not a means for improving the low external quantum efficiency inherent to each of the light emitting units.

JP-A No. 2003-45676 discloses a multi-photon type organic EL device, in which a plurality of light-emitting layers are isolated from each other by an electrically insulating charge generation layer. However, in this configuration as well, the light emitting units are merely stacked in a plurality, and this cannot provide a means for improving the low external quantum efficiency inherent to each of the light emitting units.

Compatibility between high external quantum efficiency and high driving durability is extremely important for designing a light emitting device which is practically useful, and this is a subject for which improvement is continuously demanded.

SUMMARY OF THE INVENTION

The present invention has been made in view of the above circumstances and provides an organic electroluminescent element, comprising at least a light-emitting layer interposed between a pair of electrodes, wherein the light-emitting layer is divided into at least three layers in a thickness direction thereof including a light-emitting layer A close to an anode, a light-emitting layer C close to a cathode and a light-emitting layer B between the light-emitting layer A and the light-emitting layer C;

a thickness (a) of the light-emitting layer A, a thickness (c) of the light-emitting layer C and a thickness (b) of the light-emitting layer B satisfy the relationship of a<b<c; and an intermediate layer containing an electron blocking material is disposed between the divided light-emitting layers.

A second aspect of the present invention is to provide an organic electroluminescent element, comprising at least a light-emitting layer interposed between a pair of electrodes, wherein the light-emitting layer is divided into at least three layers in a thickness direction thereof including a light-emitting layer A close to an anode, a light-emitting layer C close to a cathode and a light-emitting layer B between the light-emitting layer A and the light-emitting layer C;

a thickness (a) of the light-emitting layer A, a thickness (c) of the light-emitting layer C and a thickness (b) of the light-emitting layer B satisfy the relationship of a>b>c; and an intermediate layer containing a hole blocking material is disposed between the divided light-emitting layers.

DETAILED DESCRIPTION OF THE INVENTION

Figure 1:
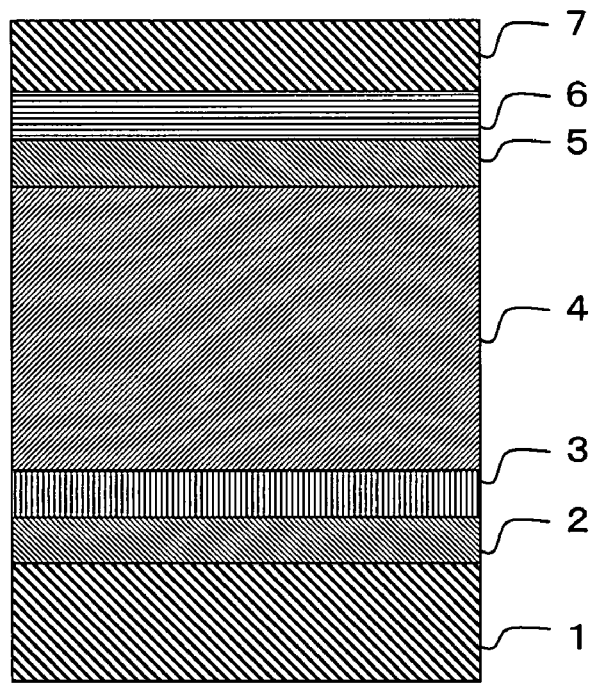
FIG. 1 is a conceptual view of the layer configuration of a comparative light emitting device.

The invention is intended to provide an organic EL device that is improved in external quantum efficiency and driving durability.

An organic electroluminescent element of the invention is an organic electroluminescent element formed by interposing at least a light-emitting layer between a pair of electrodes. In one aspect thereof, the light-emitting layer is divided into at least three layers in a thickness direction thereof, a thickness (a) of a light-emitting layer A close to an anode, a thickness (c) of a light-emitting layer C close to a cathode and a thickness (b) of a light-emitting layer B between the light-emitting layer A and the light-emitting layer C satisfy the relationship of a<b<c, and between the divided light-emitting layers, an intermediate layer containing an electron blocking material is disposed.

In another aspect of the organic EL element of the invention, the relationship of a>b>c is satisfied, and between the divided light-emitting layers, an intermediate layer containing a hole blocking material is disposed.

That is, the organic EL element of the invention has a multi-layer laminated structure where the light-emitting layer is segmentalized into thin layers in a thickness direction, and between the segmentalized light-emitting layers, an intermediate layer is disposed, with thicknesses of the segmentalized light-emitting layers having a particular relationship.

The light-emitting layer of the invention is segmentalized into three or more layers. In the case of at least 4 layers being contained, when 3 layers of the at least 4 layers are arbitrarily selected, the three layers have only to satisfy the foregoing relationship of the thicknesses. For instance, in the case of an intermediate layer containing an electron blocking material being used, when a thickness of a light-emitting layer A closest to an anode is thinnest, and a thickness of a light-emitting layer C closest to a cathode is thickest, thicknesses of a plurality of intermediate light-emitting layers may vary, as far as the thicknesses of the intermediate layers are therebetween. Preferably, the plurality of intermediate light-emitting layers has lager thickness in the intermediate light-emitting layer close to the intermediate light-emitting layer A than that closer to intermediate light-emitting layer C, or in the alternative, has smaller thickness in the intermediate light-emitting layer close to the intermediate light-emitting layer A than that closer to intermediate light-emitting layer C.

As a result of analysis of causes why the external quantum efficiency in a light-emitting element is low, it has been inferred that a primary emission occurs in the neighborhood of a very limited interface of a light-emitting layer and an adjacent layer, and that charges, being localized in a very limited interface, gradually deteriorate before the recombination occurs.

As a result of earnest investigation for improvement, it has been found that the foregoing problem can be overcome by an embodiment in which a light-emitting layer is divided and segmentalized into a plurality of thin layers in a thickness direction thereof and an intermediate layer having a charge blocking ability is disposed as an intermediate layer between the respective divided light-emitting layers. That is, a distance between a region where electrons are localized and a region where holes are localized is shortened, and thereby a recombination speed is made faster, resulting in an improvement in the efficiency. Furthermore, since that which connects between light-emitting units of the respective thin layers is an intermediate layer, the driving resistance is not greatly increased, and light generated in the respective elements can be efficiently extracted externally. Still furthermore, it was found that, in the case of an intermediate layer being a charge blocking layer containing an electron blocking material, when thicknesses of divided light-emitting layers are respectively expressed by a thickness (a) for a light-emitting layer A close to an anode, a thickness (c) for a light-emitting layer C close to a cathode and a thickness (b) for a light-emitting layer B between the light-emitting layers A and C, and the relationship of a<b<c is satisfied, the emission efficiency can be particularly improved, whereby the invention has been attained. Alternatively, as another aspect, in the case of an intermediate layer being a charge blocking layer containing a hole blocking material, when thicknesses of the divided light-emitting layers are set in the relationship of a>b>c, the emission efficiency has been found to be particularly improved, resulting in completion of the invention.

Preferably, when a light-emitting material is further included in the intermediate layer, the layer can be made light-emissive and emission of higher brightness can be obtained.

1. Segmentation of Light-Emitting Layer

The organic EL device of the invention has at least a light-emitting layer interposed between a pair of electrodes in which the light-emitting layer is divided along the thickness direction thereof and an intermediate layer is disposed between the divided light-emitting layers. The intermediate layer functions as a charge blocking layer. In the present application, light-emitting layers the finely divided in the thickness direction of the light-emitting layer is sometimes referred to as a "unit light-emitting layers".

The thickness of the unit light-emitting layer in the invention is preferably 2 nm to 100 nm, more preferably 2 nm to 80 nm, and further preferably 2 nm to 60 nm.

The light-emitting layer in the invention is finely divided along the thickness direction thereof preferably into 3 layers to 50 layers, and more preferably into 4 layers to 30 layers.

The unit light-emitting layers in the invention are connected by an intermediate layer. Preferably, the device comprises at least four unit light-emitting layers and three intermediate layers connecting them along the thickness direction thereof.

Preferably, the unit light-emitting layers in the invention comprise at least one light emitting material and at least one host material. More preferably, the light emitting material is a phosphorescence light emitting material.

The intermediate layer in the invention preferably contains a light emitting material. The intermediate layer in the invention contains a hole blocking material or an electron blocking material as the charge blocking material.

Preferably, the light-emitting layer contains a phosphorescence material as the light emitting material.

(Intermediate Layer)

The intermediate layer in the invention will be described in more detail.

The intermediate layer in the invention functions as a electric charge blocking layer.

The charge blocking layer in the invention is a layer having a function of suppressing electrons transported from a cathode to a light-emitting layer from passing through to an anode, or suppressing holes transported from an anode to the light-emitting layer from passing through to the cathode, but this is not a layer for completely inhibiting the migration of carriers.

Preferably, the intermediate layer contains a light emitting material. More preferably, the intermediate layer contains a phosphorescence material as the light emitting material.

1) Electron Blocking Material in the Intermediate Layer

An electron blocking material in the intermediate layer in the present invention is a material having an Ea value thereof in a range of 1.5 eV to 3.0 eV, and preferably in a range of 2.0 eV to 2.8 eV. In an electron blocking material used in the intermediate layer in the invention, Ea (electron affinity) thereof is preferably smaller than the smallest Ea of materials constituting the light-emitting layer. The materials constituting the light-emitting layer in the invention are s light-emitting dopants or host materials.

Furthermore, in the electron blocking material used in the intermediate layer in the invention, the electron mobility thereof is preferably slower than that of a material in which electrons mainly flow among materials that constitute the light-emitting layer. A material in which electrons mainly flow of the light-emitting layer is a light-emitting dopant or an electron transporting host material. Accordingly, although the electron mobility of an electron blocking material preferably used in the invention may be different depending on a material of the light-emitting layer, it is generally preferably slower than $1.0 \times 10^{-5}$ cm$^2$/V·s and more preferably slower than $1.0 \times 10^{-6}$ cm$^2$/V·s.

Specific examples of the electron blocking materials satisfying these conditions preferably include hole transporting materials such as carbazole derivatives such as N,N'-di-carbazolyl-3,5-benzene (hereinafter, referred to as "mCP" in some cases) and N,N'-di-carbazole-4,4'-biphenyl (hereinafter, referred to as CBP in some cases), azacarbazole derivatives, indole derivatives, azaindole derivatives, pyrene derivatives, pyrrole derivatives, triazole derivatives or oxazole derivatives. Particularly preferable examples include hole transporting materials such as carbazole derivatives such as mCP and CBP and pyrene derivatives. However, as far as it is a material that can control so that electrons can appropriately enter into a light-emitting layer, there is no particular restriction.

As specific compounds of the electron blocking materials, for instance, hole transporting materials such as shown below can be cited, but the invention is not limited thereto.

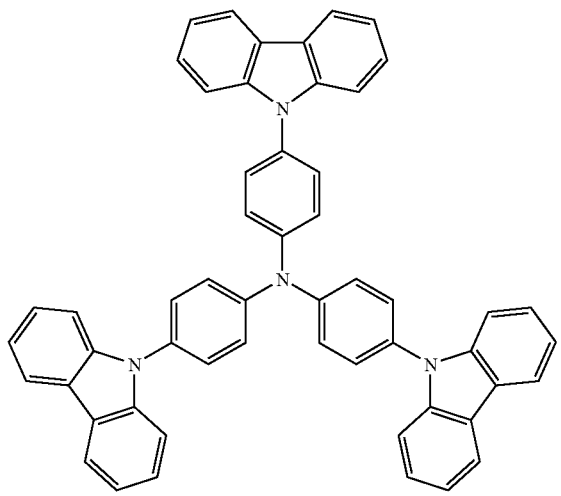

Hole Transporting Material A

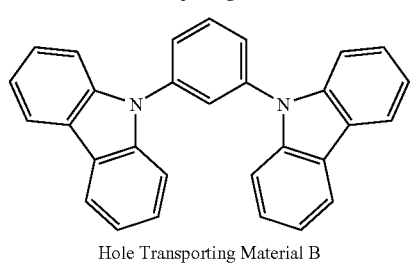

Hole Transporting Material B

-continued

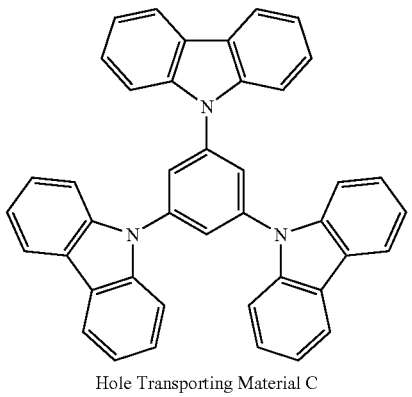

Hole Transporting Material C

2) Hole Blocking Material in the Intermediate Layer

A hole blocking material in the intermediate layer in the present invention is a material having a Ip value thereof in a range of 5.0 eV to 8.0 eV, and preferably in a range of 5.5 eV to 7.0 eV.

In a hole blocking material used in the intermediate layer in the invention, Ip (ionization potential) is preferably larger than the largest Ip of materials constituting the light-emitting layer. The materials constituting the light-emitting layer in the invention are light-emitting dopants or host materials.

Furthermore, in the hole blocking material used in the intermediate layer in the invention, the hole mobility thereof is preferably slower than that of a material in which holes mainly flow among materials that constitute the light-emitting layer. A material in which holes mainly flow of the light-emitting layer is a light-emitting dopant or a hole transporting host material. Although the hole mobility of a hole blocking material preferably used in the invention may be different depending on a material of the light-emitting layer, it is generally preferably slower than $1 \times 10^{-4}$ cm$^2$/V·s and more preferably slower than $1 \times 10^{-5}$ cm$^2$/V·s.

Specific examples of the hole blocking materials satisfying these conditions preferably include electron transporting materials such as aluminum complexes such as aluminium (III) bis-(2-methyl-8-quinolinato)-4-pnenylphenolate (hereinafter, referred to as BAlq in some cases), triazole derivatives, phenanthroline derivatives such as 2,9-Dimethyl-4,7-diphenyl-1,10-phenanthroline (hereinafter, referred to as BCP in some cases), and imidazopyridine derivatives. Particularly preferable examples include electron transporting materials such as imidazopyridine derivatives. However, as far as it is a material that can control so that holes can appropriately enter into a light-emitting layer, there is no particular restriction.

As specific compounds of the hole blocking materials, for instance, electron transporting materials such as shown below can be cited, but the invention is not limited thereto.

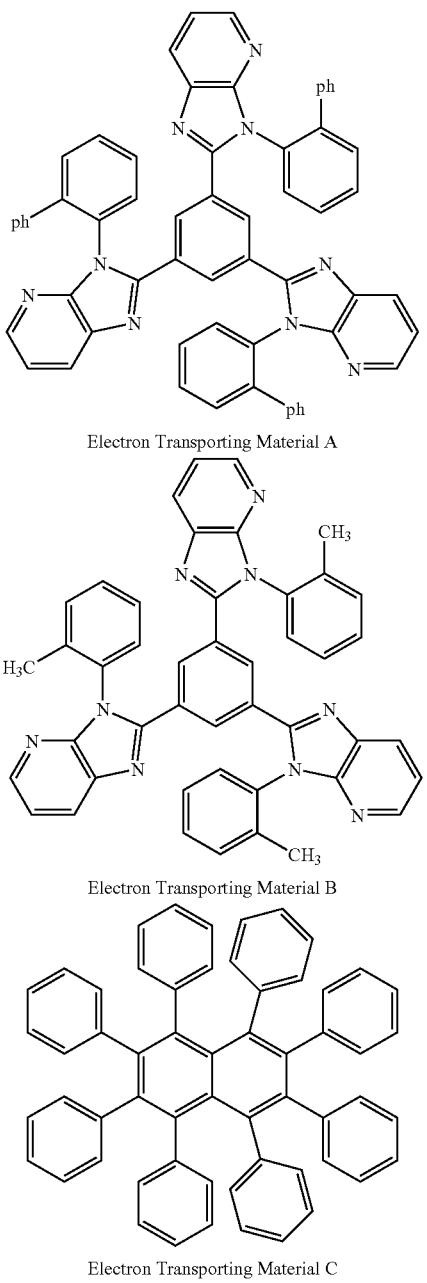

Electron Transporting Material A

Electron Transporting Material B

Electron Transporting Material C

3) Constitution of Intermediate Layer

In general, the constituent ratio of the intermediate layer preferably comprises from 5% by volume to 90% by volume of the charge blocking material, from 0% by volume to 30% by volume of the light emitting material, and from 0% by volume to 95% by volume of the charge transport material (total for the light emitting material and the charge transport material: 10% by volume to 95% by volume), further preferably, from 10% by volume to 80% by volume of the charge blocking material, 0% by volume to 30% by volume of the light emitting material, and 0% by volume to 90% by volume of the charge transporting material (total for the light emitting material and the charge transporting material: 20% by volume to 80% by volume), and even further preferably, from 30% by volume to 70% by volume the charge blocking material, from 0% by volume to 30% by volume of the light emitting material, and from 0% by volume to 70% by volume of the charge transport material (total for the light emitting material and the charge transport material: 30% by volume to 70% by volume).

In a case where the charge blocking material, exceeds 90% by volume, mobility of carriers is hindered greatly to increase the driving voltage, which is not preferred. In a case where the charge blocking material, is less than 5% by volume, since the charge blocking performance is scarcely exhibited, this results in a problem in that the effect of improving the external quantum efficiency is not obtained, which is not preferred.

4) Thickness of the Intermediate Layer

For preventing an increase in driving voltage, in general, the thickness of the intermediate layer in the invention is preferably from 3 nm to 100 nm, more preferably from 5 nm to 30 nm, and even more preferably from 5 nm to 20 nm.

In a case where the thickness exceeds 100 nm, mobility of carriers is hindered greatly to result in a problem of increasing the driving voltage, which is not preferred. In a case where the thickness is less than 3 nm, the layer is not formed sufficiently and partially or entirely loses the function as the charge blocking layer, which is not preferred.

5) Number of Layers of the Intermediate Layer

The number of layers of the intermediate layer in the invention is preferably from 2 to 49, more preferably from 3 to 29, and further preferably from 4 to 14.

(Division of Light-Emitting Layer)

The division of the light-emitting layer, which is used in the invention, will be described. Compositions of the respective light-emitting layers will be detailed in the description of the light-emitting layer below.

In the configuration of the invention, a light-emitting layer is divided and segmentalized in a thickness direction thereof into unit light-emitting layers of 3 layers or more, preferably 4 layers to 30 layers, and more preferably 5 layers to 15 layers. In the case where an intermediate layer includes an electron blocking material, thicknesses of the unit light-emitting layers preferably become thinner sequentially from a cathode side toward an anode side. On the other hand, in the case where the intermediate layer includes a hole blocking material, thicknesses of the unit light-emitting layers preferably become thinner sequentially from an anode side toward a cathode side.

A thickness of a unit light-emitting layer in the invention is preferably 2 nm to 100 nm, more preferably 2 nm to 80 nm, and still more preferably 2 nm to 60 nm.

A difference in thicknesses of the unit light-emitting layers in the invention is preferably 10% to 150% of a thickness of the unit light-emitting layer and more preferably 20% to 100%. When the difference in thicknesses of adjacent light-emitting layers is less than 10%, the effects of the invention cannot be sufficiently exerted, and further, when it exceeds 150%, the effects of the present invention cannot be sufficiently exerted owing to excessively large difference in a carrier distribution.

A plurality of light-emitting layers in the invention may be layers exhibiting light emission identical or exhibiting light emission different from each other with each other with respect to wavelengths of the emitted light. For example, in a case of layers exhibiting identical light emission in wavelengths, light emission at high brightness can be taken out. On the other hand, in a case of light emission of wavelengths different from each other, it is possible to obtain light emission of a desired tone, or to obtain white light emission, depending on the combination of respective light emission wavelengths.

(Divided Layer Constitution)

The layer constitution is to be described with reference to the drawings. In the illustrated constitution, only the layers necessary for describing the intention of the present application are shown. Those elements that are necessary for the light emitting device but not directly necessary for the explanation of the invention are omitted.

FIG. 1 is a schematic view of the layer constitution of a comparative light emitting device. An anode electrode 1 comprising ITO, etc. is present on a substrate (not illustrated), and a hole injection layer 2, a hole transport layer 3, a light-emitting layer 4, an electron transport layer 5, an electron injection layer 6, and a cathode 7 made of a metal such as aluminum are disposed in order thereon.

Figure 2:
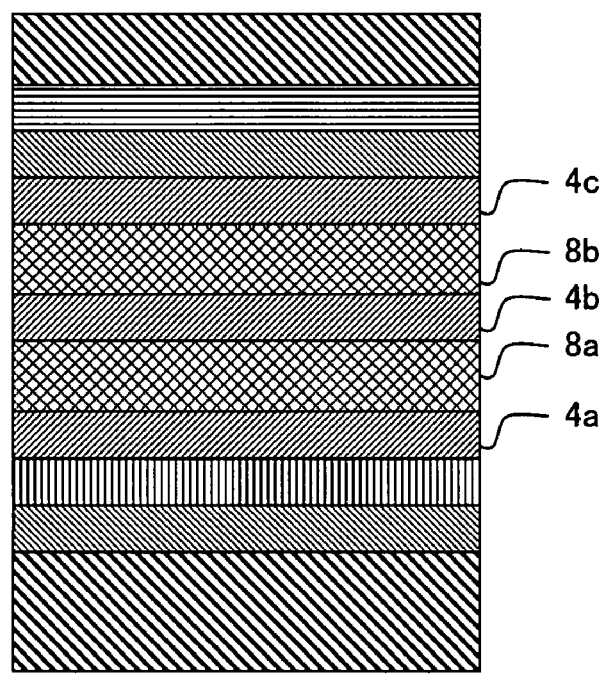
FIG. 2 is a conceptual view of the layer configuration of another comparative light emitting device.

FIG. 2 is a schematic view of the layer constitution of another comparative light emitting device in which a light-emitting layer is divided into three light-emitting layers of a first unit light-emitting layer 4a, a second unit light-emitting layer 4b and a third unit light-emitting layer 4c, and intermediate layers 8a and 8b are disposed therebetween. The total thickness including the three divided light-emitting layers and two intermediate layers in FIG. 2 is substantially identical with that for the light-emitting layer 4 in FIG. 1.

Figure 3:
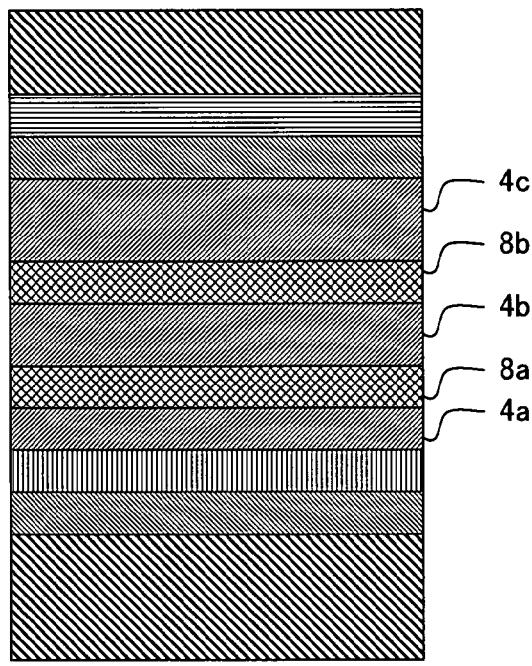
FIG. 3 is a conceptual view of an example of a light emitting device according to the invention, wherein a light-emitting layer is divided to three unit light-emitting layers, and an intermediate layer is disposed between the unit light-emitting layers.

FIG. 3 shows an example of a light emitting device of the invention in which a light-emitting layer is divided into a first unit light-emitting layer 4a, a second unit light-emitting layer 4b and a third unit light-emitting layer 4c, and intermediate layers 8a and 8b are disposed therebetween. The intermediate layers 8a and 8b each contain an electron blocking material. The thicknesses of the unit light-emitting layers are configured such that the first unit light-emitting layer 4a, the second unit light-emitting layer 4b, and the third unit light-emitting layer 4c increase in thickness in this order. The total thickness including the three divided light-emitting layers and two intermediate layers in FIG. 3 is substantially identical with that for the light-emitting layer 4 in FIG. 1.

Figure 4:
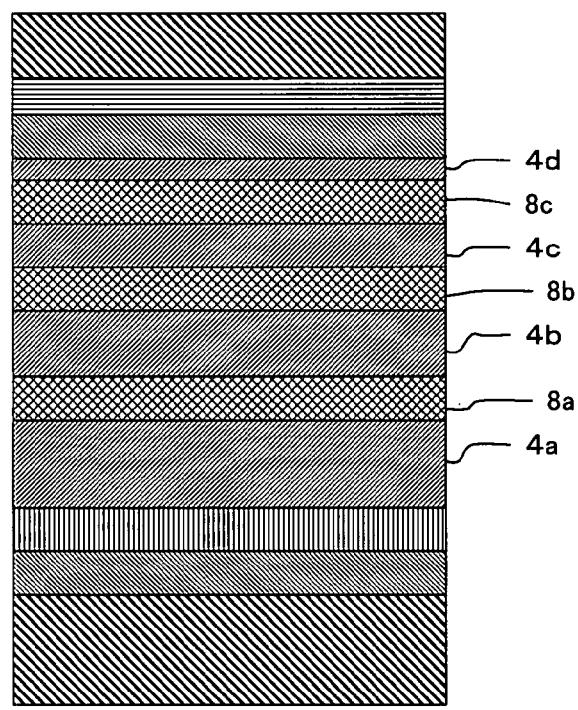
FIG. 4 is a conceptual view of a layer configuration of another example of the light emitting device according to the present invention in which a light-emitting layer is divided into four layers with an intermediate layer being disposed between each of the four layers.

FIG. 4 shows another example of the layer constitution of the invention. The light-emitting layer is divided into four portions 4a, 4b, 4c and 4d, and respective intermediate layers 8a, 8b, and 8c are disposed between the respective divided unit light-emitting layers. The intermediate layers each contain a hole blocking material. Among the thicknesses of the divided unit light-emitting layers, the first unit light-emitting layer 4a is thinnest. The thickness of the second unit light-emitting layer 4b is thicker than that of third unit light-emitting layer 4c, and these thicknesses are intermediate to that of the fourth unit light-emitting layer 4d, and that of the first unit light-emitting layer 4a. The total thickness including the four divided light-emitting layers and three intermediate layers in FIG. 4 is substantially equal with that for the light-emitting layer 4 in FIG. 1.

2. Organic EL Element

As a lamination pattern of the organic compound layers according to the present invention, it is preferred that the layers are laminated in the order of a hole transport layer, a light-emitting layer, and an electron transport layer from the anode side. Moreover, a hole injection layer between the hole transport layer and the anode and/or an electron transporting intermediate layer between the light-emitting layer and the electron transport layer may be provided. In addition, a hole transporting intermediate layer may be provided in between the light-emitting layer and the hole transport layer, and similarly, an electron injection layer may be provided in between the cathode and the electron transport layer.

The preferred modes of the organic compound layers in the organic electroluminescence element of the present invention are as follows. (1) An embodiment having a hole injection layer, a hole transport layer (the hole injection layer may also have the role of the hole transport layer), a hole transporting intermediate layer, a light-emitting layer, an intermediate layer, an electron transport layer, and an electron injection layer (the electron transport layer may also have the role of the electron injection layer); (2) an embodiment having a hole injection layer, a hole transport layer (the hole injection layer may also have the role of the hole transport layer), a light-emitting layer, an intermediate layer, an electron transporting immediate layer, an electron transport layer, and an electron injection layer (the electron transport layer may also have the role of the electron injection layer); and (3) an embodiment having a hole injection layer, a hole transport layer (the hole injection layer may also have the role of the hole transport layer), a hole transporting intermediate layer, a light-emitting layer, an intermediate layer, an electron transporting intermediate layer, an electron transport layer, and an electron injection layer (the electron transport layer may also have the role of the electron injection layer).

The above-described hole transporting intermediate layer preferably has at least either a function for accelerating the injection of holes into the light-emitting layer, or a function for blocking electrons.

Furthermore, the above-described electron transporting intermediate layer preferably has at least either a function for accelerating the injection of electrons into the light-emitting layer, or a function for blocking holes.

Moreover, at least either of the above-described hole transporting intermediate layer and the electron transporting intermediate layer preferably has a function for blocking excitons produced in the light-emitting layer.

In order to realize effectively the functions for accelerating the injection of holes, or the injection of electrons, and the functions for blocking holes, electrons, or excitons, it is preferred that the hole transporting intermediate layer and the electron transporting intermediate layer are adjacent to the light-emitting layer.

The respective layers mentioned above may be separated into a plurality of secondary layers.

An organic EL element of the invention may have a resonator structure. For instance, on a transparent substrate, a multi-layered film mirror that is made of a plurality of laminated films that are different in refractive index, a transparent or translucent electrode, a light-emitting layer and a metal electrode are stacked. Light generated in the light-emitting layer repeats reflections between the multi-layered film mirror and the metal electrode as a reflective plate to resonate.

In another preferable embodiment, on a transparent substrate, a transparent or translucent electrode and a metal electrode respectively function as reflective plates, and light generated in a light-emitting layer repeats reflections therebetween to resonate.

In order to form a resonant structure, an optical path determined from effective refractive indices of two reflective plates and the refractive indices and thicknesses of the respective layers between the reflective plates is controlled so as to be an optimum value to obtain a desired resonant wavelength. A calculation equation in the case of the first embodiment is described in JP-A No. 9-180883. A calculation equation in the case of the second embodiment is described in JP-A No. 2004-127795.

The respective layers that constitute organic compound layers in the present invention can be preferably formed by any method of dry layering methods such as a vapor deposition method and a sputtering method, a transferring method, a printing method, a coating method, a ink jet method, or a spray method.

Next, the components constituting the electroluminescence device of the present invention will be described in detail.

(Light-Emitting Layer)

The light-emitting layer is a layer having a function for receiving holes from the anode, the hole injection layer, the hole transport layer or the hole transporting intermediate layer, and receiving electrons from the cathode, the electron injection layer, the electron transport layer, or the electron transporting intermediate layer, and for providing a field for recombination of the holes with the electrons to emit a light.

The light-emitting layer of the present invention contains at least one type of luminescent dopant and at least one host material.

The luminescent dopant and the host material contained in the light-emitting layer of the present invention may be either a combination of a fluorescence luminescent dopant in which the luminescence (fluorescence) from a singlet exciton is obtained and the host material, or a combination of a phosphorescence luminescent dopant in which the luminescence (phosphorescence) from triplet exciton is obtained and the host material.

The light-emitting layer of the present invention may contain two or more types of luminescent dopants for improving color purity and expanding the luminescent wavelength region.

Any of phosphorescent emission materials, fluorescent emission materials and the like may be used as the luminescent dopant in the present invention.

It is preferred that the luminescent dopant in the present invention is one satisfying a relationship between the above-described host compound and the luminescent dopant of 1.2 eV>the difference of Ip between host material and light emitting dopant ($\Delta$Ip)>0.2 eV and/or 1.2 eV>the difference of Ea between host material and light emitting dopant ($\Delta$Ea)>0.2 eV in view of driving durability.

<<Phosphorescence Luminescent Dopant>>

The phosphorescent emission material are not limited specifically, but generally include complexes containing transition metal atoms or lantanoid atoms.

For instance, although the transition metal atoms are not limited, they are preferably ruthenium, rhodium, palladium, tungsten, rhenium, osmium, iridium, or platinum; more preferably rhenium, iridium, and platinum, or even more preferably iridium, or platinum.

Examples of the lantanoid atoms include lanthanum, cerium, praseodymium, neodymium, samarium, europium, gadolinium, terbium, dysprosium, holmium, erbium, thulium, ytterbium, and lutetium, and among these lantanoid atoms, neodymium, europium, and gadolinium are preferred.

Examples of ligands in the complex include the ligands described, for example, in "Comprehensive Coordination Chemistry" authored by G. Wilkinson et al., published by Pergamon Press Company in 1987; "Photochemistry and Photophysics of Coordination compounds" authored by H. Yersin, published by Springer-Verlag Company in 1987; and "YUHKI KINZOKU KAGAKU—KISO TO OUYOU—(Metalorganic Chemistry—Fundamental and Application—)" authored by Akio Yamamoto, published by Shokabo Publishing Co., Ltd. in 1982.

Specific examples of the ligands include preferably halogen ligands (preferably chlorine ligands), aromatic carboxycyclic ligands (e.g., cyclopentadienyl anions, benzene anions, or naphthyl anions and the like), nitrogen-containing heterocyclic ligands (e.g., phenylpyridine, benzoquinoline, quinolinol, bipyridyl, or phenanthroline and the like), diketone ligands (e.g., acetylacetone and the like), carboxylic acid ligands (e.g., acetic acid ligands and the like), alcoholate ligands (e.g., phenolate ligands and the like), carbon monoxide ligands, isonitryl ligands, and cyano ligand, and more preferably nitrogen-containing heterocyclic ligands.

The above-described complexes may be either a complex containing one transition metal atom in the compound, or a so-called polynuclear complex containing two or more transition metal atoms wherein different metal atoms may be contained at the same time.

Among these, specific examples of the luminescent dopants include phosphorescence luminescent compounds described in patent documents such as U.S. Pat. No. 6,303,238B1, U.S. Pat. No. 6,097,147, WO00/57676, WO00/70655, WO01/08230, WO01/39234A2, WO01/41512A1, WO02/02714A2, WO02/15645A1, WO02/44189A1, JP-A No. 2001-247859, Japanese Patent Application No. 2000-33561, JP-A Nos. 2002-117978, 2002-225352, and 2002-235076, Japanese Patent Application No. 2001-239281, JP-A No. 2002-170684, EP1211257, JP-A Nos. 2002-226495, 2002-234894, 2001-247859, 2001-298470, 2002-173674, 2002-203678, 2002-203679, 2004-357791, and 2006-256999, Japanese Patent Application No. 2005-75341, etc.

<<Fluorescence Luminescent Dopant>>

Examples of the above-described fluorescent emission materials include, for example, a benzoxazole derivative, a benzimidazole derivative, a benzothiazole derivative, a styrylbenzene derivative, a polyphenyl derivative, a diphenylbutadiene derivative, a tetraphenylbutadiene derivative, a naphthalimide derivative, a coumarin derivative, a perylene derivative, a perinone derivative, an oxadiazole derivative, an aldazine derivative, a pyralidine derivative, a cyclopentadiene derivative, a bis-styrylanthracene derivative, a quinacridone derivative, a pyrrolopyridine derivative, a thiadiazolopyridine derivative, a styrylamine derivative, aromatic dimethylidene compounds, a variety of metal complexes represented by metal complexes or rare-earth complexes of 8-quinolynol, polymer compounds such as polythiophene, polyphenylene and polyphenylenevinylene, organic silanes, and the like. These compounds may be used singularly or in a combination of two or more.

Among these, specific examples of the luminescent dopants include the following compounds, but it should be noted that the present invention is not limited thereto.

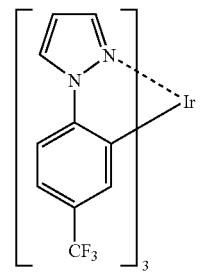

D-1

-continued
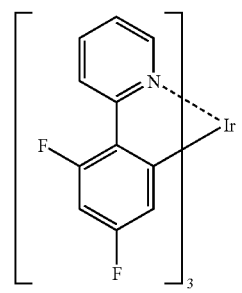
D-2
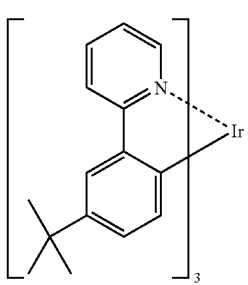
D-3
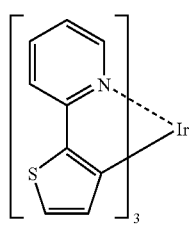
D-4
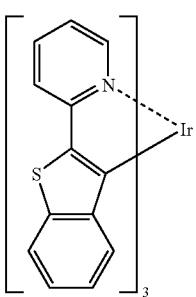
D-5
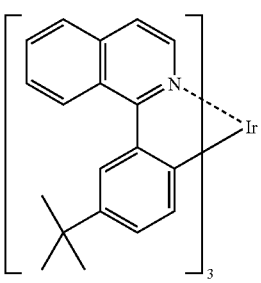
D-6
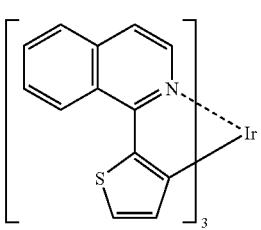
D-7
-continued
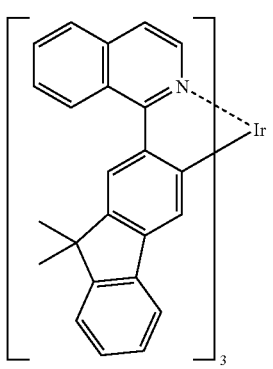
D-8
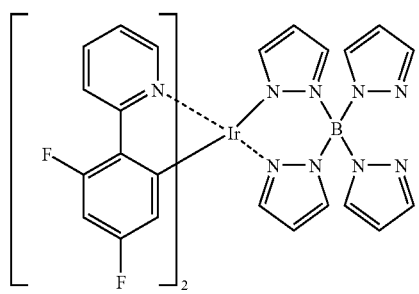
D-9
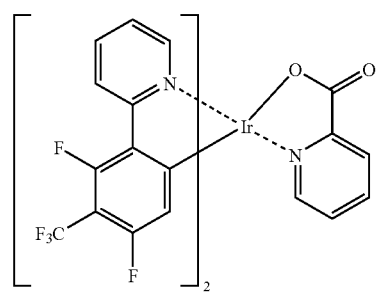
D-10
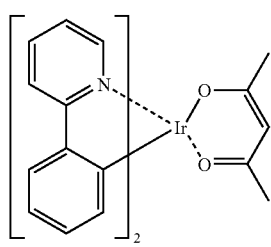
D-11
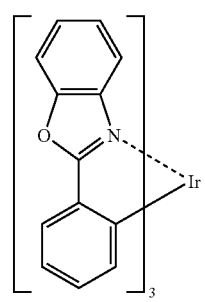
D-12

-continued
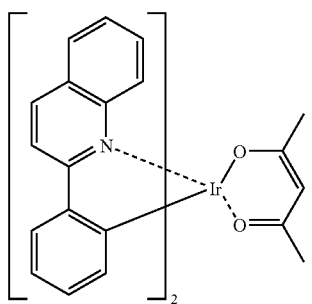
D-13
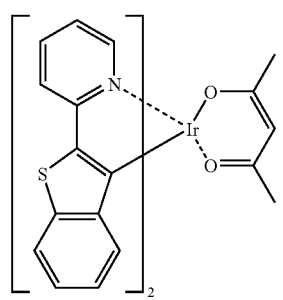
D-14
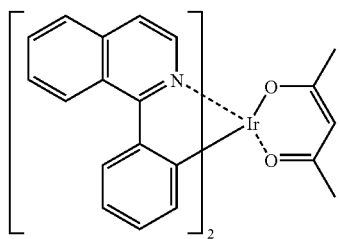
D-15
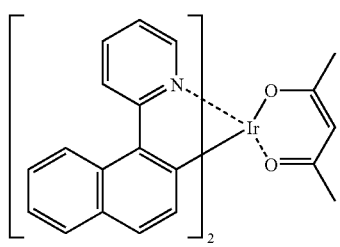
D-16
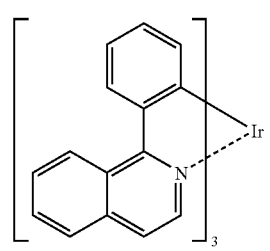
D-17
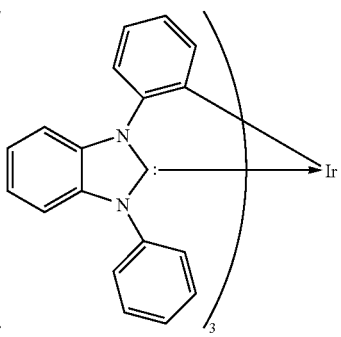
D-18
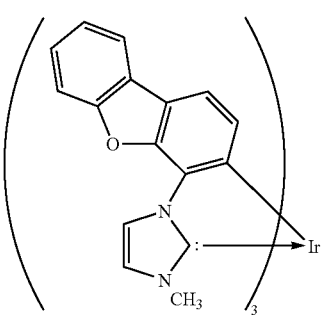
D-19
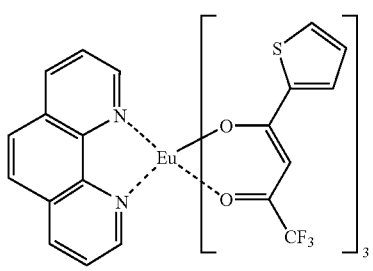
D-20
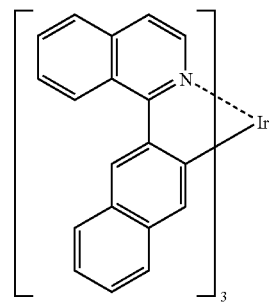
D-21
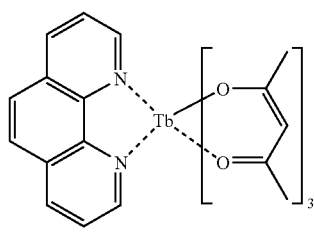
D-22

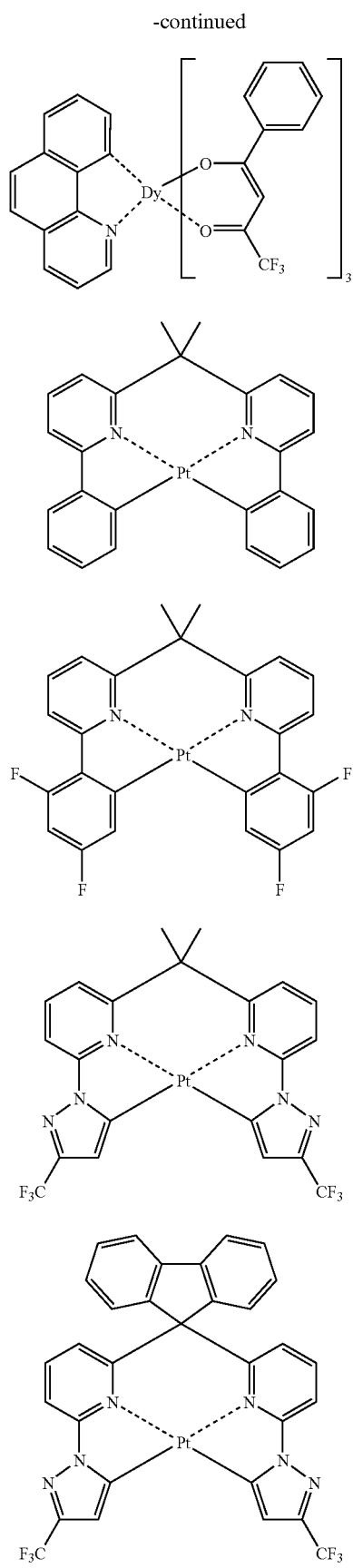
Among the above-described compounds, as the luminescent dopants to be used according to the present invention, D-2 to D-19, and D-24 to D-31 are preferable, D-2 to D-8, D-12, D-14 to D-19, D-24 to D-27, and D-28 to D-31 are more preferable, and D-24 to D-27, and D-28 to D-31 are further preferable in view of external quantum efficiency, and durability.

The luminescent dopant in a light-emitting layer is contained in an amount of 0.1% by volume to 30% by volume with respect to the total mass of the compounds generally forming the light-emitting layer, but it is preferably contained in an amount of 2% by volume to 30% by volume, and more preferably in an amount of 5% by volume to 30% by volume in view of durability and external quantum efficiency.

(Host Material)

As the host materials to be used according to the present invention, hole transporting host materials excellent in hole transporting property (referred to as a "hole transporting host" in some cases) and electron transporting host compounds excellent in electron transporting property (referred to as an "electron transporting host" in some cases) may be used.

<<Hole Transporting Host>>

The hole transporting host used for the organic layer of the present invention preferably has an ionization potential Ip of 5.1 eV to 6.4 eV, more preferably has an ionization potential of 5.4 eV to 6.2 eV, and further preferably has an ionization potential of 5.6 eV to 6.0 eV in view of improvements in durability and decrease in driving voltage. Furthermore, it preferably has an electron affinity Ea of 1.2 eV to 3.1 eV, more preferably of 1.4 eV to 3.0 eV, and further preferably of 1.8 eV to 2.8 eV in view of improvements in durability and decrease in driving voltage.

Specific examples of such hole transporting hosts as mentioned above include pyrrole, carbazole, azacarbazole, indole, azaindole, pyrazole, imidazole, polyarylalkane, pyrazoline, pyrazolone, phenylenediamine, arylamine, amino-substituted chalcone, styrylanthracene, fluorenone, hydrazone, stilbene, silazane, aromatic tertiary amine compounds, styrylamine compounds, aromatic dimethylidine compounds, porphyrin compounds, polysilane compounds, poly (N-vinylcarbazole), aniline copolymers, electric conductive high-molecular oligomers such as thiophene oligomers, polythiophenes and the like, organic silanes, carbon films, derivatives thereof, and the like.

Among these, indole derivatives, carbazole derivatives, azaindole derivatives, azacarbazole derivatives, aromatic tertiary amine compounds, and thiophene derivatives are preferable, and particularly, compounds containing a plurality of carbazole skeletons, indole skeletons and/or aromatic tertiary amine skeletons in a molecule are preferred.

As specific examples of the hole transporting hosts described above, the following compounds may be listed, but the present invention is not limited thereto.

H-1

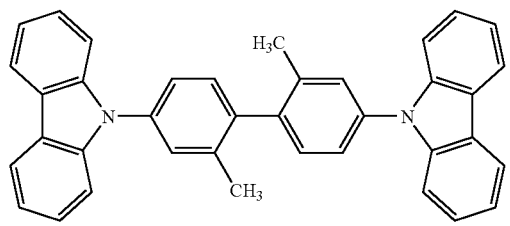

H-2

-continued

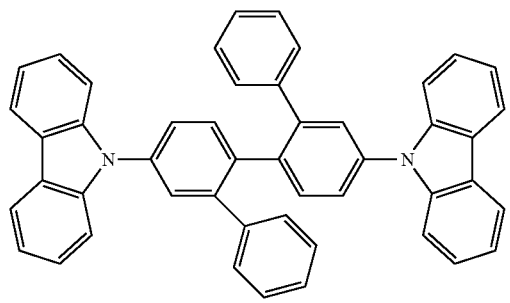

H-3

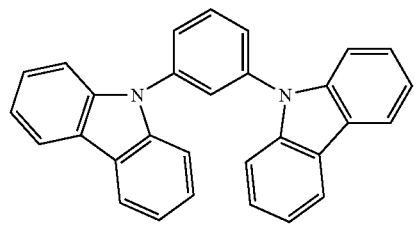

H-4

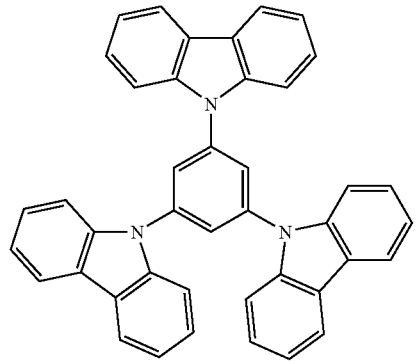

H-5

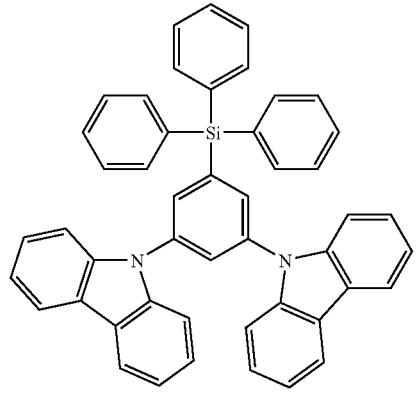

H-6

H-7
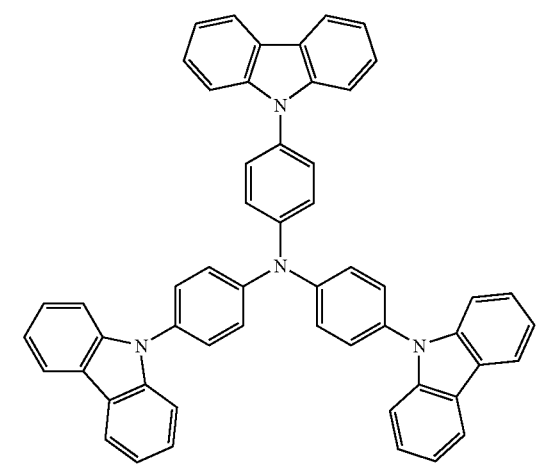
H-8
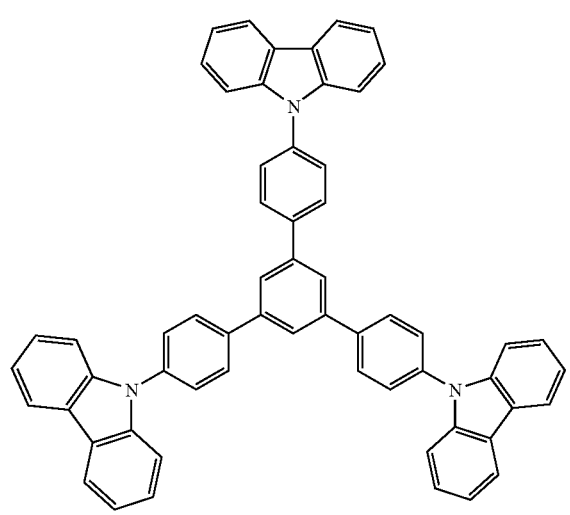
H-9
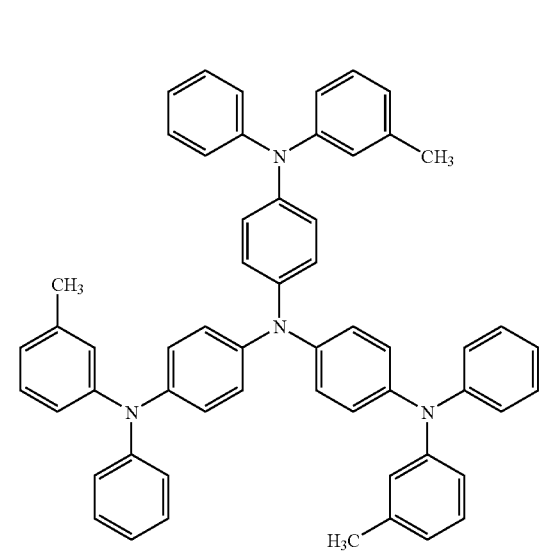
H-10
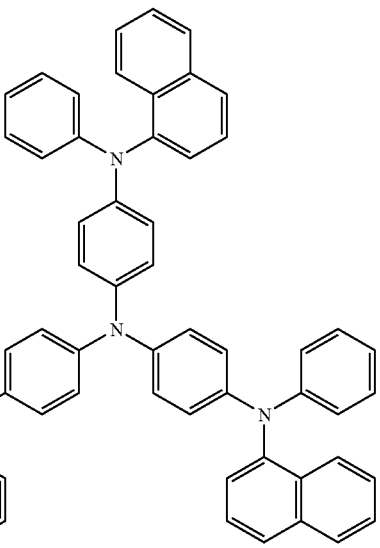
H-11
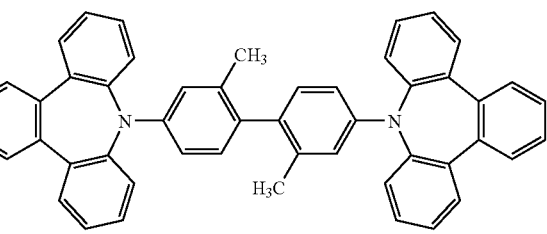
H-12
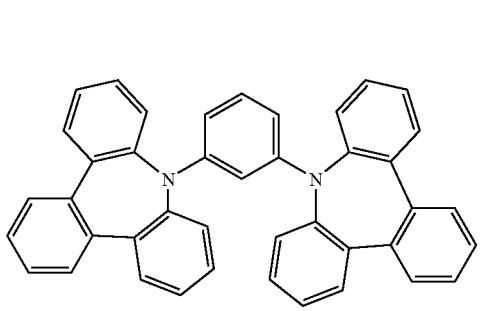
H-13

-continued
H-14
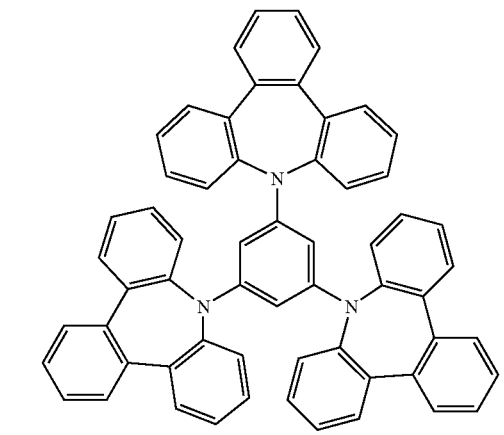
H-15
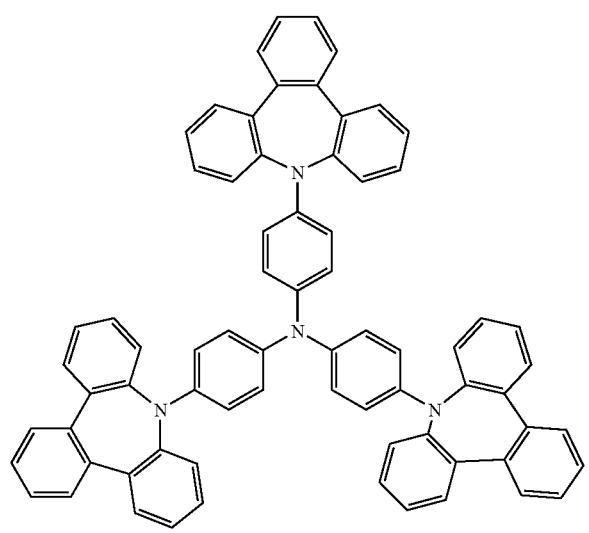
H-16
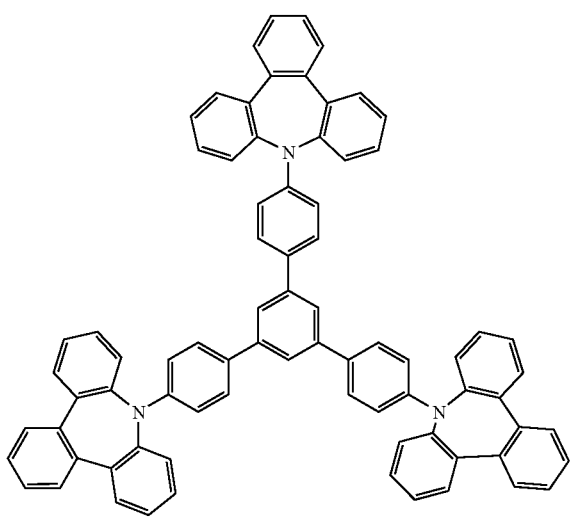
-continued
H-17
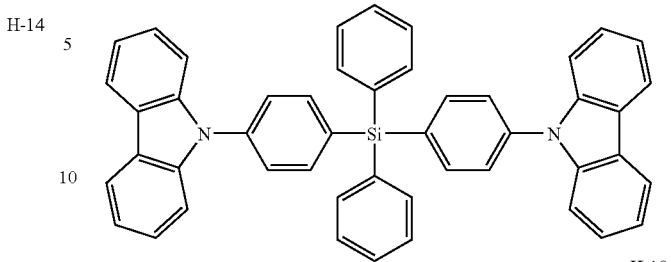
H-18
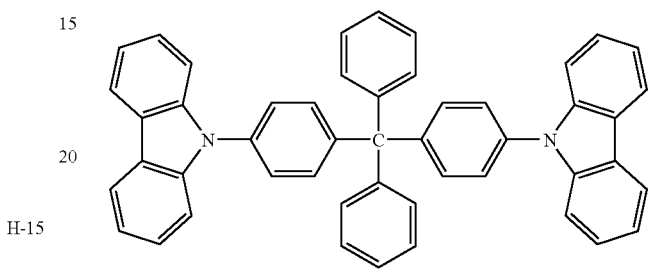
H-19
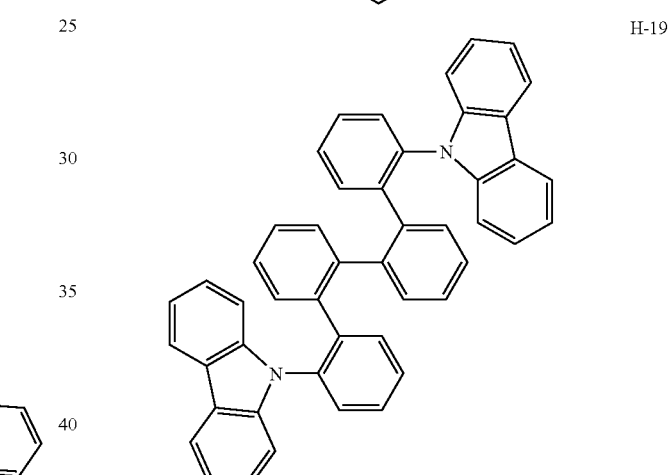
H-20
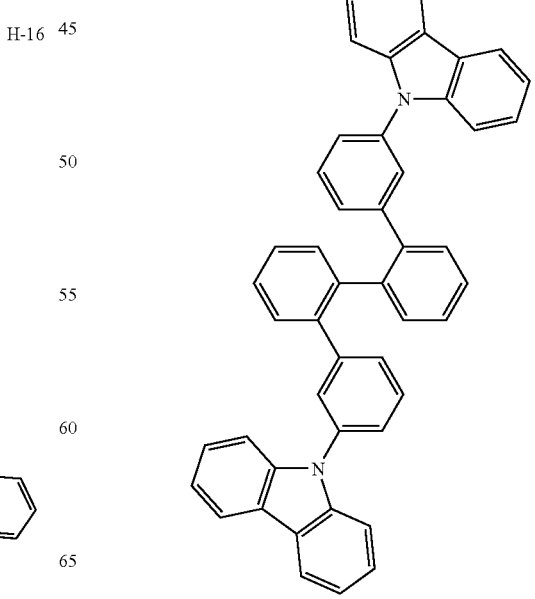

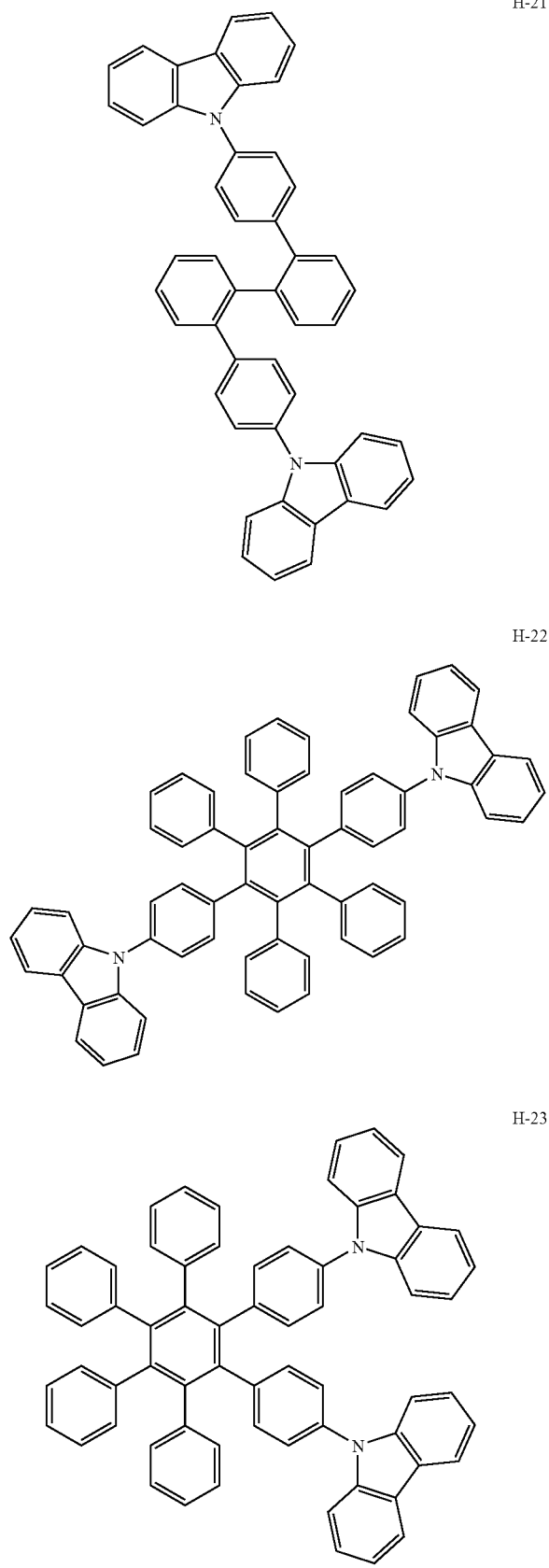

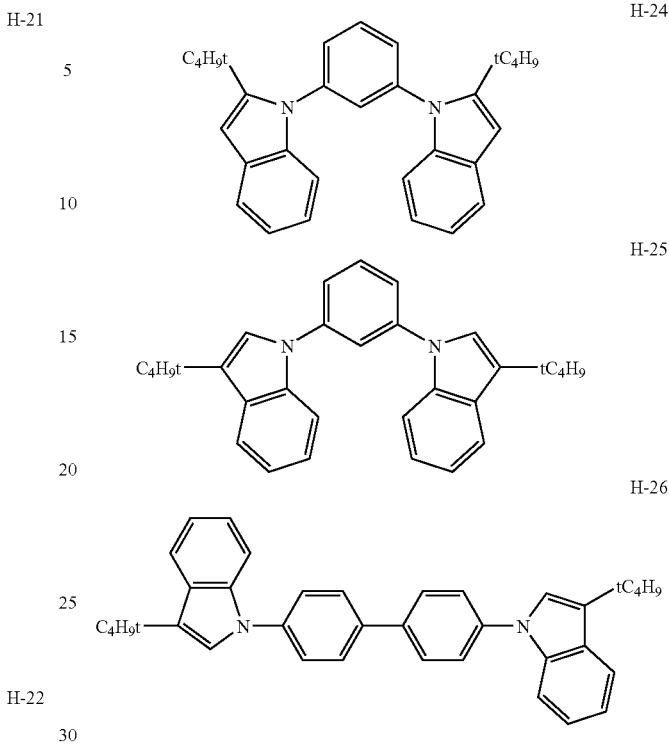

<<Electron Transporting Host>>

As the electron transporting host used according to the present invention, it is preferred that an electron affinity Ea of the host is 2.5 eV to 3.5 eV, more preferably 2.6 eV to 3.4 eV, and further preferably 2.8 eV to 3.3 eV in view of improvements in durability and decrease in driving voltage. Furthermore, it is preferred that an ionization potential Ip of the host is 5.7 eV to 7.5 eV, more preferably 5.8 eV to 7.0 eV, and further preferably 5.9 eV to 6.5 eV in view of improvements in durability and decrease in driving voltage.

Specific examples of such electron transporting hosts as mentioned above include pyridine, pyrimidine, triazine, imidazole, pyrazole, triazole, oxazole, oxadiazole, fluorenone, anthraquinonedimethane, anthrone, diphenylquinone, thiopyrandioxide, carbodiimide, fluorenylidenemethane, distyrylpyradine, fluorine-substituted aromatic compounds, heterocyclic tetracarboxylic anhydrides such as naphthaleneperylene and the like, phthalocyanine, derivatives thereof (which may form a condensed ring with another ring), and a variety of metal complexes represented by metal complexes of 8-quinolynol derivatives, metal phthalocyanine, and metal complexes having benzoxazole or benzothiazole as the ligand.

Preferable electron transporting hosts are metal complexes, azole derivatives (benzimidazole derivatives, imidazopyridine derivatives and the like), and azine derivatives (pyridine derivatives, pyrimidine derivatives, triazine derivatives and the like). Among these, metal complexes are preferred according to the present invention in view of durability. As the metal complex compound, a metal complex containing a ligand having at least one nitrogen atom, oxygen atom, or sulfur atom to be coordinated with the metal is more preferable.

Although a metal ion in the metal complex is not particularly limited, a beryllium ion, a magnesium ion, an aluminum ion, a gallium ion, a zinc ion, an indium ion, a tin ion, a platinum ion, or a palladium ion is preferred; more preferable is a beryllium ion, an aluminum ion, a gallium ion, a zinc ion, a platinum ion, or a palladium ion; and further preferable is an aluminum ion, a zinc ion, or a palladium ion.

Although there are a variety of well-known ligands to be contained in the above-described metal complexes, examples thereof include ligands described in "Photochemistry and Photophysics of Coordination Compounds" authored by H. Yersin, published by Springer-Verlag Company in 1987; "YUHKI KINZOKU KAGAKU—KISO TO OUYOU— (Metalorganic Chemistry—Fundamental and Application—)" authored by Akio Yamamoto, published by Shokabo Publishing Co., Ltd. in 1982; and the like.

The ligands are preferably nitrogen-containing heterocyclic ligands (having preferably 1 to 30 carbon atoms, more preferably 2 to 20 carbon atoms, and particularly preferably 3 to 15 carbon atoms), and they may be a unidentate ligand or a bi- or higher-dentate ligand. Preferable are bi- to hexa-dentate ligands, and mixed ligands of bi- to hexa-dentate ligands with a unidentate ligand are also preferable.

Examples of the ligands include azine ligands (e.g. pyridine ligands, bipyridyl ligands, terpyridine ligands and the like); hydroxyphenylazole ligands (e.g. hydroxyphenylbenzimidazole ligands, hydroxyphenylbenzoxazole ligands, hydroxyphenylimidazole ligands, hydroxyphenylimidazopyridine ligands and the like); alkoxy ligands (those having preferably 1 to 30 carbon atoms, more preferably 1 to 20 carbon atoms, and particularly preferably 1 to 10 carbon atoms, examples of which include methoxy, ethoxy, butoxy, 2-ethylhexyloxy and the like); aryloxy ligands (those having preferably 6 to 30 carbon atoms, more preferably 6 to 20 carbon atoms, and particularly preferably 6 to 12 carbon atoms, examples of which include phenyloxy, 1-naphthyloxy, 2-naphthyloxy, 2,4,6-trimethylphenyloxy, 4-biphenyloxy and the like); heteroaryloxy ligands (those having preferably 1 to 30 carbon atoms, more preferably 1 to 20 carbon atoms, and particularly preferably 1 to 12 carbon atoms, examples of which include pyridyloxy, pyrazyloxy, pyrimidyloxy, quinolyloxy and the like); alkylthio ligands (those having preferably 1 to 30 carbon atoms, more preferably 1 to 20 carbon atoms, and particularly preferably 1 to 12 carbon atoms, examples of which include methylthio, ethylthio and the like); arylthio ligands (those having preferably 6 to 30 carbon atoms, more preferably 6 to 20 carbon atoms, and particularly preferably 6 to 12 carbon atoms, examples of which include phenylthio and the like); heteroarylthio ligands (those having preferably 1 to 30 carbon atoms, more preferably 1 to 20 carbon atoms, and particularly preferably 1 to 12 carbon atoms, examples of which include pyridylthio, 2-benzimidazolylthio, 2-benzooxazolylthio, 2-benzothiazolylthio and the like); siloxy ligands (those having preferably 1 to 30 carbon atoms, more preferably 3 to 25 carbon atoms, and particularly preferably 6 to 20 carbon atoms, examples of which include a triphenylsiloxy group, a triethoxysiloxy group, a triisopropylsiloxy group and the like); aromatic hydrocarbon anion ligands (those having preferably 6 to 30 carbon atoms, more preferably 6 to 25 carbon atoms, and particularly preferably 6 to 20 carbon atoms, examples of which include a phenyl anion, a naphthyl anion, an anthranyl anion and the like anion); aromatic heterocyclic anion ligands (those having preferably 1 to 30 carbon atoms, more preferably 2 to 25 carbon atoms, and particularly preferably 2 to 20 carbon atoms, examples of which include a pyrrole anion, a pyrazole anion, a triazole anion, an oxazole anion, a benzoxazole anion, a thiazole anion, a benzothiazole anion, a thiophene anion, a benzothiophene anion and the like); indolenine anion ligands and the like. Among these, nitrogen-containing heterocyclic ligands, aryloxy ligands, heteroaryloxy groups, aromatic hydrocarbon anion ligands, aromatic heterocyclic anion ligands or siloxy ligands are preferable, and nitrogen-containing heterocyclic ligands, aryloxy ligands, siloxy ligands, aromatic hydrocarbon anion ligands, or aromatic heterocyclic anion ligands are more preferable.

Examples of the metal complex electron transporting hosts include compounds described, for example, in Japanese Patent Application Laid-Open Nos. 2002-235076, 2004-214179, 2004-221062, 2004-221065, 2004-221068, 2004-327313 and the like.

Specific examples of these electron transporting hosts include the following materials, but it should be noted that the present invention is not limited thereto.

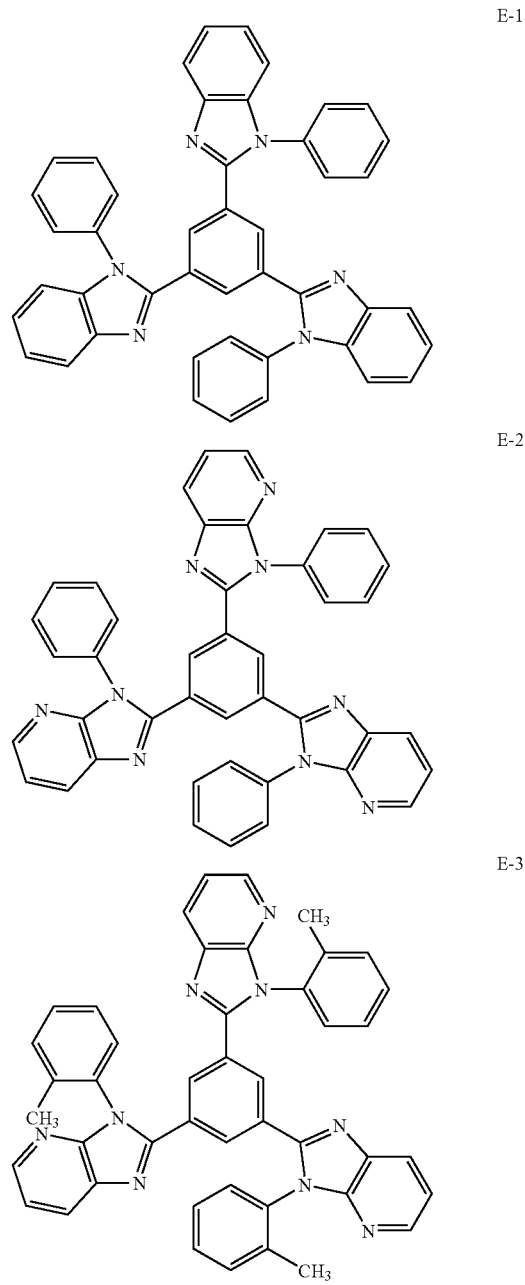

-continued
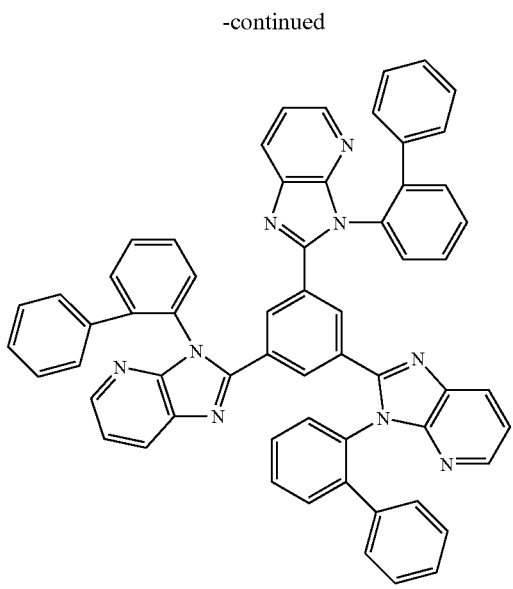
E-4
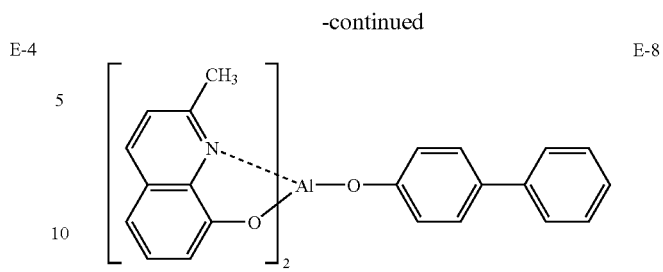
E-8
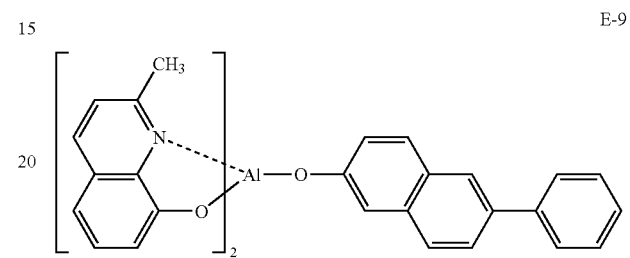
E-9
E-5
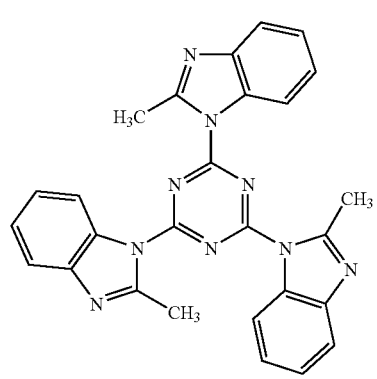
E-10
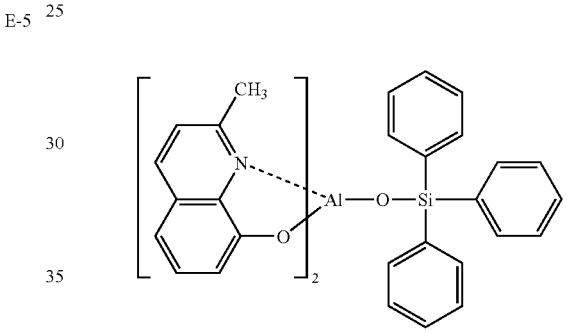
E-6
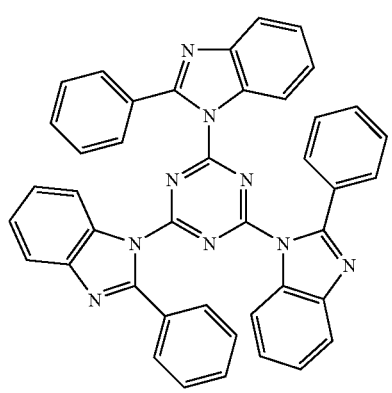
E-11
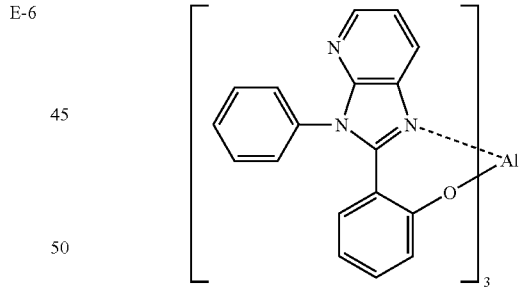
E-7
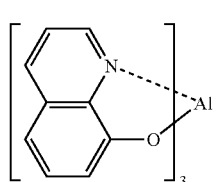
E-12
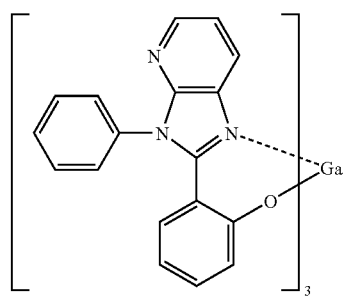

-continued
E-13
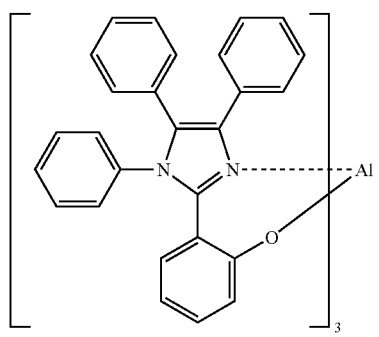
E-14
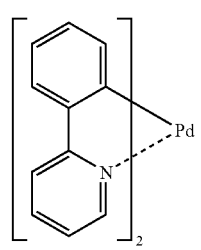
E-15
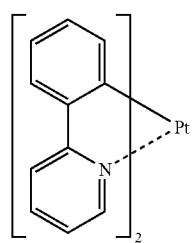
E-16
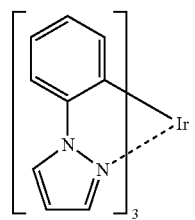
E-17
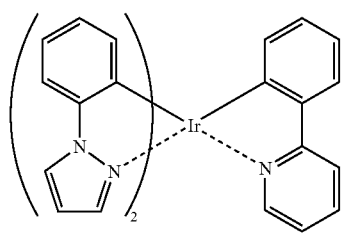
E-18
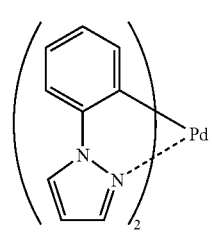
-continued
E-19
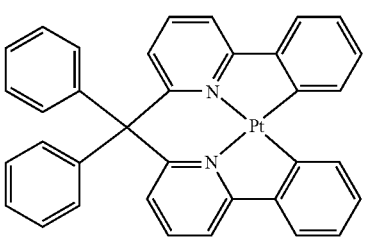
E-20
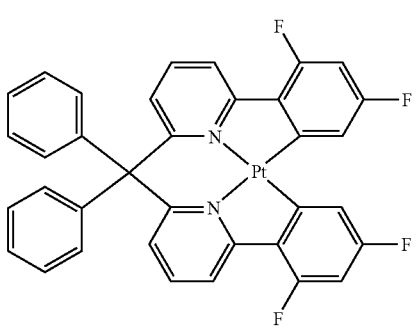
E-21
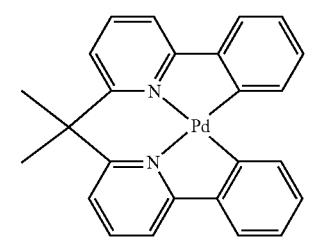
E-22
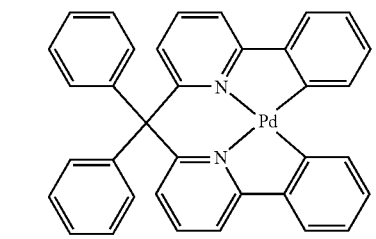
E-23
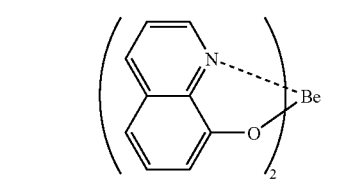
E-24
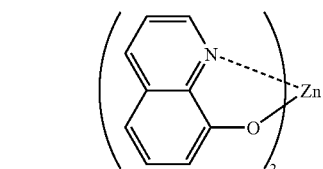

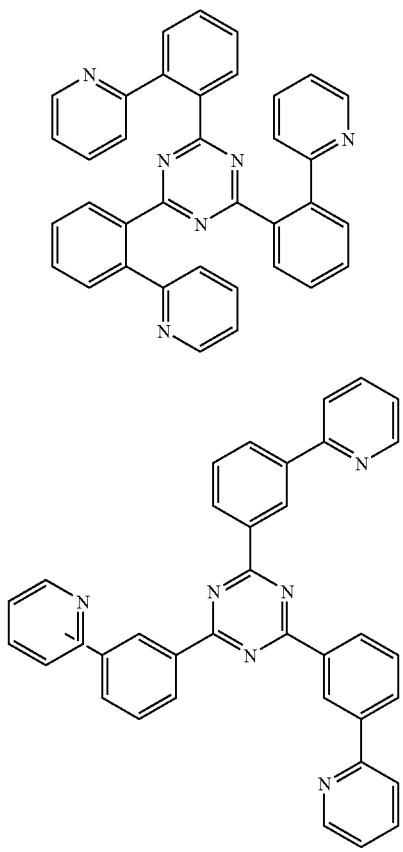

As the electron transportation hosts, E-1 to E-6, E-8, E-9, E-10, E-21, or E-22 is preferred, E-3, E-4, E-6, E-8, E-9, E-10, E-21, or E-22 is more preferred, and E-3, E-4, E-21, or E-22 is further preferred.

In the light-emitting layer of the present invention, it is preferred that when a phosphorescence luminescent dopant is used as the luminescent dopant, the lowest triplet excitation energy T1(D) in the phosphorescence luminescent dopant and the minimum value among the lowest triplet excitation energies T1(H) min in the plural host compounds satisfy the relationship of T1(H) min>T1(D) in view of color purity, external quantum efficiency, and driving durability.

Although a content of the host compounds according to the present invention is not particularly limited, it is preferably 70% by volume to 95% by volume with respect to the total volume of the compounds forming the light-emitting layer in view of external quantum efficiency and driving voltage.

(Hole Injection Layer and Hole Transport Layer)

The hole injection layer and hole transport layer correspond to layers functioning to receive holes from an anode or from an anode side and to transport the holes to a cathode side.

The hole injection layer or a hole transport layer preferably contains a dopant which serves as a carrier for holes. The dopant to be introduced into a hole injection layer or a hole transport layer, either of an inorganic compound or an organic compound may be used as long as the compound has electron accepting property and a function for oxidizing an organic compound. Specifically, inorganic compounds such as Lewis acid compounds, for example, ferric chloride, aluminum chloride, gallium chloride, indium chloride, antimony pentachloride and the like.

In case of the organic compounds, compounds having substituents such as a nitro group, a halogen, a cyano group, or a trifluoromethyl group; quinone compounds, acid anhydride compounds, and fullerenes may be preferably applied.

Specific examples of the organic compounds include hexacyanobutadiene, hexacyanobenzene, tetracyanoethylene, tetracyanoquinodimethane, tetrafluorotetracyanoquinodimethane, p-fluoranil, p-chloranil, p-bromanil, p-benzoquinone, 2,6-dichlorobenzoquinone, 2,5-dichlorobenzoquinone, tetramethylbenzoquinone, 1,2,4,5-tetracyanobenzene, o-dicyanobenzene, p-dicyanobenzene, 1,4-dicyanotetrafluorobenzene, 2,3-dichloro-5,6-dicyanobenzoquinone, p-dinitrobenzene, m-dinitrobenzene, o-dinitrobenzene, p-cyanonitrobenzene, m-cyanonitrobenzene, o-cyanonitrobenzene, 1,4-naphthoquinone, 2,3-dichloronaphthoquinone, 1-nitronaphthalene, 2-nitronaphthalene, 1,3-dinitronaphthalene, 1,5-dinitronaphthalene, 9-cyanoanthoracene, 9-nitroanthracene, 9,10-anthraquinone, 1,3,6,8-tetranitrocarbazole, 2,4,7-trinitro-9-fluorenone, 2,3,5,6-tetracyanopyridine, maleic anhydride, phthalic anhydride, fullerene C60, and fullerene C70. Other specific examples include materials described in patent documents such as JP-A Nos. 6-212153, 11-111463, 11-251067, 2000-196140, 2000-286054, 2000-315580, 2001-102175, 2001-160493, 2002-252085, 2002-56985, 2003-157981, 2003-217862, 2003-229278, 2004-342614, 2005-72012, 2005-166637, 2005-209643 and the like.

Among these, hexacyanobutadiene, hexacyanobenzene, tetracyanoethylene, tetracyanoquinodimethane, tetrafluorotetracyanoquinodimethane, p-fluoranil, p-chloranil, p-bromanil, p-benzoquinone, 2,6-dichlorobenzoquinone, 2,5-dichlorobenzoquinone, 1,2,4,5-tetracyanobenzene, 1,4-dicyanotetrafluorobenzene, 2,3-dichloro-5,6-dicyanobenzoquinone, p-dinitrobenzene, m-dinitrobenzene, o-dinitrobenzene, 1,4-naphthoquinone, 2,3-dichloronaphthoquinone, 1,3-dinitronaphthalene, 1,5-dinitronaphthalene, 9,10-anthraquinone, 1,3,6,8-tetranitrocarbazole, 2,4,7-trinitro-9-fluorenone, 2,3,5,6-tetracyanopyridine, or fullerene C60 is preferable. Hexacyanobutadiene, hexacyanobenzene, tetracyanoethylene, tetracyanoquinodimethane, tetrafluorotetracyanoquinodimethane, p-fluoranil, p-chloranil, p-bromanil, 2,6-dichlorobenzoquinone, 2,5-dichlorobenzoquinone, 2,3-dichloronaphthoquinone, 1,2,4,5-tetracyanobenzene, 2,3-dichloro-5,6-dicyanobenzoquinone, or 2,3,5,6-tetracyanopyridine is particularly preferred.

These electron-accepting dopants may be used alone or in a combination of two or more of them.

Although an applied amount of these electron-accepting dopants depends on the type of material, 0.01% by volume to 50% by volume of a dopant is preferred with respect to a hole injection material, 0.05% by volume to 20% by volume is more preferable, and 0.1% by volume to 10% by volume is particularly preferred. When the amount applied is less than 0.01% by volume with respect to the hole injection material, it is not desirable because the advantageous effects of the present invention are insufficient, and when it exceeds 50% by volume, hole injection ability is deteriorated, and thus, this is not preferred.

In a case where the hole injection layer contains an acceptor, it is preferred that the hole transport layer has no substantial acceptor.

As a material for the hole injection layer and the hole transport layer, it is preferred to contain specifically pyrrole derivatives, carbazole derivatives, azacarbazole derivatives, indole derivatives, azaindole derivatives, pyrazole derivatives, imidazole derivatives, polyarylalkane derivatives, pyrazoline derivatives, pyrazolone derivatives, phenylenediamine derivatives, arylamine derivatives, amino-substituted calcon derivatives, styrylanthracene derivatives, fluorenone derivatives, hydrazone derivatives, stilbene derivatives, silazane derivatives, aromatic tertiary amine compounds, styrylamine derivatives, aromatic dimethylidine compounds, porphyrin compounds, organosilane compounds, carbon or the like.

Although a thickness of the hole injection layer and the hole transport layer is not particularly limited, it is preferred that the thickness is 1 nm to 5 µm, it is more preferably 5 nm to 1 µm, and 10 nm to 500 nm is particularly preferred in view of decrease in driving voltage, improvements in external quantum efficiency, and improvements in durability.

The hole injection layer and the hole transport layer may be composed of a mono-layered structure comprising one or two or more of the above-mentioned materials, or a multilayer structure composed of plural layers of a homogeneous composition or a heterogeneous composition.

When the carrier transportation layer adjacent to the light-emitting layer is a hole transport layer, it is preferred that the Ip (HTL) of the hole transport layer is smaller than the Ip (D) of the dopant contained in the light-emitting layer in view of driving durability.

The Ip (HTL) in the hole transport layer may be measured in accordance with the below-mentioned measuring method of Ip.

A carrier mobility in the hole transport layer is usually from $10^{-7}$ $cm^2.V^{-1}.s^{-1}$ to $10^{-1}$ $cm^2.V^{-1}.s^{-1}$, and in this range, from $10^{-5}$ $cm^2.V^{-1}.s^{-1}$ to $10^{-1}$ $cm^2.V^{-1}.s^{-1}$ is preferable, from $10^{-4}$ $cm^2.V^{-1}.s^{-1}$ to $10^{-1}$ $cm^2.V^{-1}.s^{-1}$ is more preferable, and from $10^{-3}$ $cm^2.V^{-1}.s^{-1}$ to $10^{-1}$ $cm^2.V^{-1}.s^{-1}$ is particularly preferable in view of the external quantum efficiency.

For the carrier mobility, a value measured in accordance with the same method as that of the carrier mobility of the above-described light-emitting layer is adopted.

Moreover, it is preferred that the carrier mobility in the hole transport layer is higher than that in the above-described light-emitting layer in view of driving durability and external quantum efficiency.

(Electron Injection Layer and Electron Transport Layer)

The electron injection layer and the electron transport layer are layers having any of functions for injecting electrons from the cathode, transporting electrons, and becoming a barrier to holes which could be injected from the anode.

As a material applied for the electron-donating dopant with respect to the electron injection layer or the electron transport layer, any material may be used as long as it has an electron-donating property and a property for reducing an organic compound, and alkaline metals such as Li, alkaline earth metals such as Mg, and transition metals including rare-earth metals are preferably used.

Particularly, metals having a work function of 4.2 eV or less are preferably applied, and specific examples thereof include Li, Na, K, Be, Mg, Ca, Sr, Ba, Y, Cs, La, Sm, Gd, and Yb.

These electron-donating dopants may be used alone or in a combination of two or more of them.

An applied amount of the electron-donating dopants differs dependent on the types of the materials, but it is preferably 0.1% by volume to 99% by volume with respect to an electron transport layer material, more preferably 1.0% by volume to 80% by volume, and particularly preferably 2.0% by volume to 70% by volume. When the amount applied is less than 0.1% by volume with respect to the electron transport layer material, the effects of the present invention are insufficient so that it is not desirable, and when it exceeds 99% by volume, the electron transportation ability is deteriorated so that it is not preferred.

Specific examples of the materials applied for the electron injection layer and the electron transport layer include pyridine, pyrimidine, triazine, imidazole, triazole, oxazole, oxadiazole, fluorenone, anthraquinodimethane, anthrone, diphenylquinone, thiopyrandioxide, carbodiimide, fluorenylidenemethane, distyrylpyradine, fluorine-substituted aromatic compounds, naphthalene, heterocyclic tetracarboxylic anhydrides such as perylene, phthalocyanine, and the derivatives thereof (which may form condensed rings with the other rings); and metal complexes represented by metal complexes of 8-quinolinol derivatives, metal phthalocyanine, and metal complexes containing benzoxazole or benzothiazole as the ligand.

Although a thickness of the electron injection layer and the electron transport layer is not particularly limited, it is preferred that the thickness is 1 nm to 5 µm, it is more preferably 5 nm to 1 µm, and it is particularly preferably 10 nm to 500 nm in view of decrease in driving voltage, improvements in external quantum efficiency, and improvements in durability.

The electron injection layer and the electron transport layer may have either a mono-layered structure comprising one or two or more of the above-mentioned materials, or a multilayer structure composed of plural layers of a homogeneous composition or a heterogeneous composition.

When the carrier transportation layer adjacent to the light-emitting layer is an electron transport layer, it is preferred that the Ea (ETL) of the electron transport layer is higher than the Ea (D) of the dopants contained in the light-emitting layer in view of driving durability.

For the Ea (ETL), a value measured in accordance with the same manner as the measuring method of Ea, which will be mentioned later, is used.

Furthermore, the carrier mobility in the electron transport layer is usually from $10^{-7}$ $cm^2.V^{-1}.s^{-1}$ to $10^{-1}$ $cm^2.V^{-1}.s^{-1}$, and in this range, from $10^{-5}$ $cm^2.V^{-1}.s^{-1}$ to $10^{-1}$ $cm^2.V^{-1}.s^{-1}$ is preferable, from $10^{-4}$ $cm^2.V^{-1}.s^{-1}$ to $10^{-1}$ $cm^2.V^{-1}.s^{-1}$ is more preferable, and from $10^{-3}$ $cm^2.V^{-1}.s^{-1}$ to $10^{-1}$ $cm^2.V^{-1}.s^{-1}$ is particularly preferred, in view of external quantum efficiency.

Moreover, it is preferred that the carrier mobility in the electron transport layer is higher than that of the light-emitting layer in view of driving durability. The carrier mobility is measured in accordance with the same method as that of the hole transport layer.

As to the carrier mobility of the luminescent device of the present invention, it is preferred that the carrier mobilities in the hole transport layer, the electron transport layer, and the light-emitting layer have the relationship of (electron transport layer=hole transport layer)>light-emitting layer in view of driving durability.

(Hole Blocking Layer)

A hole blocking layer is a layer having a function to prevent the holes transported from the anode to the light-emitting layer from passing through to the cathode side. According to the present invention, a hole blocking layer may be provided as an organic compound layer adjacent to the light-emitting layer on the cathode side.

The hole blocking layer is not particularly limited, but specifically, it may contain an aluminum complex such as BAlq, a triazole derivative, a pyrazabol derivative or the like.

It is preferred that a thickness of the hole blocking layer is generally 50 nm or less in order to lower the driving voltage, more preferably it is 1 nm to 50 nm, and further preferably it is 5 nm to 40 nm.

(Anode)

The anode may generally be any material as long as it has a function as an electrode for supplying holes to the organic compound layer, and there is no particular limitation as to the shape, the structure, the size or the like. However, it may be suitably selected from among well-known electrode materials according to the application and purpose of the luminescent device. As mentioned above, the anode is usually provided as a transparent anode.

Materials for the anode may preferably include, for example, metals, alloys, metal oxides, electric conductive compounds, and mixtures thereof, and those having a work function of 4.0 eV or more are preferred. Specific examples of the anode materials include electric conductive metal oxides such as tin oxides doped with antimony, fluorine or the like (ATO and FTO), tin oxide, zinc oxide, indium oxide, indium tin oxide (ITO), and indium zinc oxide (IZO); metals such as gold, silver, chromium, and nickel; mixtures or laminates of these metals and the electric conductive metal oxides; inorganic electric conductive materials such as copper iodide and copper sulfide; organic electric conductive materials such as polyaniline, polythiophene, and polypyrrole; and laminates of these inorganic or organic electric conductive materials with ITO. Among these, the electric conductive metal oxides are preferred, and particularly, ITO is preferable in view of productivity, high electric conductivity, transparency and the like.

The anode may be formed on the substrate in accordance with a method which is appropriately selected from among wet methods such as printing methods, coating methods and the like; physical methods such as vacuum deposition methods, sputtering methods, ion plating methods and the like; and chemical methods such as CVD and plasma CVD methods and the like, in consideration of the suitability to a material constituting the anode. For instance, when ITO is selected as a material for the anode, the anode may be formed in accordance with a DC or high-frequency sputtering method, a vacuum deposition method, an ion plating method or the like.

In the organic electroluminescence element of the present invention, a position at which the anode is to be formed is not particularly limited, but it may be suitably selected according to the application and purpose of the luminescent device. The anode may be formed on either the whole surface or a part of the surface on either side of the substrate.

For patterning to form the anode, a chemical etching method such as photolithography, a physical etching method such as etching by laser, a method of vacuum deposition or sputtering through superposing masks, or a lift-off method or a printing method may be applied.

A thickness of the anode may be suitably selected according to the material constituting the anode and is therefore not definitely decided, but it is usually in the range of around 10 nm to 50 μm, and preferably 50 nm to 20 μm.

A value of resistance of the anode is preferably $10^3 \Omega/\square$ or less, and $10^2 \Omega/\square$ or less is more preferable. In the case where the anode is transparent, it may be either transparent and colorless, or transparent and colored. For extracting luminescence from the transparent anode side, it is preferred that a light transmittance of the anode is 60% or higher, and more preferably 70% or higher.

Concerning transparent anodes, there is a detailed description in "TOUMEI DENNKYOKU-MAKU NO SHINTEN-KAI (Novel Developments in Transparent Electrode Films)" edited by Yutaka Sawada, published by C.M.C. in 1999, the contents of which are incorporated by reference herein. In the case where a plastic substrate having a low heat resistance is applied, it is preferred that ITO or IZO is used to obtain a transparent anode prepared by forming the film at a low temperature of 150° C. or lower.

(Cathode)

The cathode may generally be any material as long as it has a function as an electrode for injecting electrons to the organic compound layer, and there is no particular limitation as to the shape, the structure, the size or the like. However it may be suitably selected from among well-known electrode materials according to the application and purpose of the luminescent device.

Materials constituting the cathode may include, for example, metals, alloys, metal oxides, electric conductive compounds, and mixtures thereof, and materials having a work function of 4.5 eV or less are preferred. Specific examples thereof include alkali metals (e.g., Li, Na, K, Cs or the like), alkaline earth metals (e.g., Mg, Ca or the like), gold, silver, lead, aluminum, sodium-potassium alloys, lithium-aluminum alloys, magnesium-silver alloys, rare earth metals such as indium, and ytterbium, and the like. They may be used alone, but it is preferred that two or more of them are used in combination from the viewpoint of satisfying both stability and electron injectability.

Among these, as the materials for constituting the cathode, alkaline metals or alkaline earth metals are preferred in view of electron injectability, and materials containing aluminum as a major component are preferred in view of excellent preservation stability.

The term "material containing aluminum as a major component" refers to a material constituted by aluminum alone; alloys comprising aluminum and 0.01% by volume to 10% by volume of an alkaline metal or an alkaline earth metal; or the mixtures thereof (e.g., lithium-aluminum alloys, magnesium-aluminum alloys and the like).

Regarding materials for the cathode, they are described in detail in JP-A Nos. 2-15595 and 5-121172, of which are incorporated by reference herein.

A method for forming the cathode is not particularly limited, but it may be formed in accordance with a well-known method.

For instance, the cathode may be formed in accordance with a method which is appropriately selected from among wet methods such as printing methods, coating methods and the like; physical methods such as vacuum deposition methods, sputtering methods, ion plating methods and the like; and chemical methods such as CVD and plasma CVD methods and the like, in consideration of the suitability to a material constituting the cathode. For example, when a metal (or metals) is (are) selected as a material (or materials) for the cathode, one or two or more of them may be applied at the same time or sequentially in accordance with a sputtering method or the like.

For patterning to form the cathode, a chemical etching method such as photolithography, a physical etching method such as etching by laser, a method of vacuum deposition or sputtering through superposing masks, or a lift-off method or a printing method may be applied.

In the present invention, a position at which the cathode is to be formed is not particularly limited, and it may be formed on either the whole or a part of the organic compound layer.

Furthermore, a dielectric material layer made of fluorides, oxides or the like of an alkaline metal or an alkaline earth metal may be inserted in between the cathode and the organic compound layer with a thickness of 0.1 nm to 5 nm. The dielectric layer may be considered to be a kind of electron injection layer. The dielectric material layer may be formed in accordance with, for example, a vacuum deposition method, a sputtering method, an ion-plating method or the like.

A thickness of the cathode may be suitably selected according to materials for constituting the cathode and is therefore not definitely decided, but it is usually in the range of around 10 nm to 5 μm, and preferably 50 nm to 1 μm.

Moreover, the cathode may be transparent or opaque. The transparent cathode may be formed by preparing a material for the cathode with a small thickness of 1 nm to 10 nm, and further laminating a transparent electric conductive material such as ITO or IZO thereon.

(Substrate)

According to the present invention, a substrate may be applied. The substrate to be applied is preferably one which does not scatter or attenuate light emitted from the organic compound layer. Specific examples of materials for the substrate include zirconia-stabilized yttrium (YSZ); inorganic materials such as glass; polyesters such as polyethylene terephthalate, polybutylene phthalate, and polyethylene naphthalate; and organic materials such as polystyrene, polycarbonate, polyethersulfon, polyarylate, polyimide, polycycloolefin, norbornene resin, poly(chlorotrifluoroethylene), and the like.

For instance, when glass is used as the substrate, non-alkali glass is preferably used with respect to the quality of material in order to decrease ions eluted from the glass. In the case of employing soda-lime glass, it is preferred to use glass on which a barrier coat such as silica has been applied. In the case of employing an organic material, it is preferred to use a material excellent in heat resistance, dimensional stability, solvent resistance, electrical insulation, and workability.

There is no particular limitation as to the shape, the structure, the size or the like of the substrate, but it may be suitably selected according to the application, purposes and the like of the luminescent device. In general, a plate-like substrate is preferred as the shape of the substrate. A structure of the substrate may be a monolayer structure or a laminated structure. Furthermore, the substrate may be formed from a single member or two or more members.

Although the substrate may be in a transparent and colorless, or a transparent and colored condition, it is preferred that the substrate is transparent and colorless from the viewpoint that the substrate does not scatter or attenuate light emitted from the organic light-emitting layer.

A moisture permeation preventive layer (gas barrier layer) may be provided on the front surface or the back surface of the substrate.

For a material of the moisture permeation preventive layer (gas barrier layer), inorganic substances such as silicon nitride and silicon oxide may be preferably applied. The moisture permeation preventive layer (gas barrier layer) may be formed in accordance with, for example, a high-frequency sputtering method or the like.

In the case of applying a thermoplastic substrate, a hard-coat layer or an under-coat layer may be further provided as needed.

(Protective Layer)

According to the present invention, the whole organic EL device may be protected by a protective layer.

A material contained in the protective layer may be one having a function to prevent penetration of substances such as moisture and oxygen, which accelerate deterioration of the device, into the device.

Specific examples thereof include metals such as In, Sn, Pb, Au, Cu, Ag, Al, Ti, Ni and the like; metal oxides such as MgO, SiO, $SiO_2$, $Al_2O_3$, GeO, NiO, CaO, BaO, $Fe_2O_3$, $Y_2O_3$, $TiO_2$ and the like; metal nitrides such as $SiN_x$, $SiN_xO_y$ and the like; metal fluorides such as $MgF_2$, LiF, $AlF_3$, $CaF_2$ and the like; polyethylene; polypropylene; polymethyl methacrylate; polyimide; polyurea; polytetrafluoroethylene; polychlorotrifluoroethylene; polydichlorodifluoroethylene; a copolymer of chlorotrifluoroethylene and dichlorodifluoroethylene; copolymers obtained by copolymerizing a monomer mixture containing tetrafluoroethylene and at least one co-monomer; fluorine-containing copolymers each having a cyclic structure in the copolymerization main chain; water-absorbing materials each having a coefficient of water absorption of 1% or more; moisture permeation preventive substances each having a coefficient of water absorption of 0.1% or less; and the like.

There is no particular limitation as to a method for forming the protective layer. For instance, a vacuum deposition method, a sputtering method, a reactive sputtering method, an MBE (molecular beam epitaxial) method, a cluster ion beam method, an ion plating method, a plasma polymerization method (high-frequency excitation ion plating method), a plasma CVD method, a laser CVD method, a thermal CVD method, a gas source CVD method, a coating method, a printing method, or a transfer method may be applied.

(Sealing)

The whole organic electroluminescence element of the present invention may be sealed with a sealing cap.

Furthermore, a moisture absorbent or an inert liquid may be used to seal a space defined between the sealing cap and the luminescent device. Although the moisture absorbent is not particularly limited. Specific examples thereof include barium oxide, sodium oxide, potassium oxide, calcium oxide, sodium sulfate, calcium sulfate, magnesium sulfate, phosphorus pentoxide, calcium chloride, magnesium chloride, copper chloride, cesium fluoride, niobium fluoride, calcium bromide, vanadium bromide, a molecular sieve, zeolite, magnesium oxide and the like. Although the inert liquid is not particularly limited, specific examples thereof include paraffins; liquid paraffins; fluorine-based solvents such as perfluoroalkanes, perfluoroamines, perfluoroethers and the like; chlorine-based solvents; silicone oils; and the like.

3. Driving

In the organic electroluminescence element of the present invention, when a DC (AC components may be contained as needed) voltage (usually 2 volts to 15 volts) or DC is applied across the anode and the cathode, luminescence can be obtained.

The driving durability of the organic electroluminescence device according to the present invention can be determined based on the time required for reduction to a certain brightness at a specified brightness. For instance, the brightness reduction time may be determined by using a source measure unit, model 2400, manufactured by KEITHLEY Instruments Inc. to apply a DC voltage to the organic EL device to cause it to emit light, conducting a continuous driving test under the condition that the initial brightness is 1500 $cd/m^2$ for green light emission, or 360 $cd/m^2$ for red or blue light emission, defining the time required for the brightness to reach 80% of the initial brightness as the brightness reduction time, and then comparing the resulting brightness reduction time with that of a conventional luminescent device. According to the present invention, the numerical value thus obtained was used.

An important characteristic parameter of the organic electroluminescence element of the present invention is external quantum efficiency. The external quantum efficiency is calculated by "the external quantum efficiency ($\phi$)=the number of photons emitted from the device/the number of electrons injected to the device", and it may be said that the larger the value obtained is, the more advantageous the device is in view of electric power consumption.

Moreover, the external quantum efficiency of the organic electroluminescence device is decided by "the external quantum efficiency ($\phi$)=the internal quantum efficiency×light-extraction efficiency". In an organic EL device which utilizes fluorescent luminescence from an organic compound, an upper limit of the internal quantum efficiency is 25%, while the light-extraction efficiency is about 20%, and accordingly, it is considered that an upper limit of the external quantum efficiency is about 5%.

As the numerical value of the external quantum efficiency, the maximum value thereof when the device is driven at 20° C., or a value of the external quantum efficiency at about 100 cd/m$^2$ to 2000 cd/m$^2$ (preferably 1500 cd/m$^2$ in the case of green light emission, 500 cd/m$^2$ in the case of red light emission, and 360 cd/m$^2$ in the case of blue light emission), when the device is driven at 20° C. may be used.

According to the present invention, a value obtained by the following method is used. Namely, a DC constant voltage is applied to the EL device by the use of a source measure unit, model 2400, manufactured by KEITHLEY Instruments Inc. to cause it to emit light, the brightness of the light is measured by using a brightness photometer (trade name: SR-3, manufactured by Topcon Corporation), and then, the external quantum efficiency at the luminescent brightness is calculated.

Further, an external quantum efficiency of the luminescent device may be obtained by measuring the luminescent brightness, the luminescent spectrum, and the current density, and calculating the external quantum efficiency from these results and a specific visibility curve. In other words, using the current density value, the number of electrons injected can be calculated. By an integration calculation using the luminescent spectrum and the specific visibility curve (spectrum), the luminescent brightness can be converted into the number of photons emitted. From the result, the external quantum efficiency (%) can be calculated by "(the number of photons emitted from the device/the number of electrons injected to the device)×100".

For the driving method of the organic electroluminescence element of the present invention, driving methods described in JP-A Nos. 2-148687, 6-301355, 5-29080, 7-134558, 8-234685, and 8-241047; Japanese Patent No. 2784615, U.S. Pat. Nos. 5,828,429, 6,023,308 and the like are applicable.

4. Application

The application of the light emitting device in the present invention is not particularly restricted, but it can be appropriately used in broad fields including displays for portable phones, personal digital assistants (PDA), computer displays, information display for vehicles, TV monitors, or conventional illumination light sources and the like.

EXAMPLES

In the following, examples of the organic electroluminescence element of the present invention will be described, but it should be noted that the present invention is not limited to these examples.

Example 1

1. Preparation of Organic EL Element (Preparation of Comparative Organic EL Element No. 1)

A 2.5 cm square ITO glass substrate having a 0.5 mm thickness (manufactured by Geomatec Co., Ltd.; surface resistance: 10Ω/□) was placed in a washing container to apply ultrasonic cleaning in 2-propanol, and then, UV-ozone treatment was applied for 30 minutes. On the transparent anode, the following layers were deposited in accordance with a vacuum deposition method. In the examples of the present invention, a deposition rate was 0.2 nm/second, unless otherwise specified, wherein the deposition rate was measured by the use of a quartz oscillator. The thicknesses of layers described below were also measured by using the quartz oscillator.

—Hole Injection Layer—

On the ITO layer, CuPc was deposited by the evaporation method at a thickness of 10 nm.

—Hole Transport Layer—

On the hole injection layer, α-NPD was deposited by the evaporation method at a thickness of 10 nm.

—Light-Emitting Layer—

CBP and Ir(ppy)$_3$ were co-deposited at a volume ratio of 95:5. The thickness of the light-emitting layer was 90 nm.

—Electron Transport Layer—

BAlq was deposited by the evaporation method at a thickness of 10 nm.

—Electron Injection Layer—

Alq was deposited by the evaporation method at a thickness of 20 nm.

On the resulting layers, a patterned mask (mask by which the light emitting region becomes 2 mm×2 mm) was disposed, and lithium fluoride was deposited at a thickness of 1 nm at a deposition rate of 0.01 nm/second to obtain an electron injection layer. Further, metal aluminum was deposited thereon with a 100 nm thickness to obtain a cathode.

The prepared lamination body was placed in a globe box whose contents were replaced by nitrogen gas, and it was sealed by the use of a sealing cap made of stainless steel and a UV curable adhesive (trade name: XNR5516HV, manufactured by Nagase-Ciba Co., Ltd.).

Thus, the comparative organic EL element No. 1 was obtained.

(Preparation of Comparative Organic EL Element No. 1A)

In the process of preparing the comparative organic EL element No. 1, the light-emitting layer was divided into three unit light-emitting layers as shown below, and between the respective unit light-emitting layers, intermediate layers 1 and 2 below were disposed as charge blocking layers shown below. Sequentially from a hole transporting layer, a unit light-emitting layer 1/an intermediate layer 1/a unit light-emitting layer 2/an intermediate layer 2/a unit light-emitting layer 3 were disposed.

Unit light-emitting layer 1: a light-emitting layer having a composition the same as that of comparative example 1 was vapor deposited at a film thickness of 20 nm.

Intermediate Layer 1: <Example of Intermediate Layer Containing Electron Blocking Material>

A hole transporting material B that becomes an electron blocking material and Ir(ppy)$_3$ were co-deposited at a volume ratio of 95:5 to form an intermediate layer.

Since an Ea value of the hole transporting material B that becomes an electron blocking material is 2.5 eV and an Ea value of CBP that mainly transports electrons in the light-emitting layer is 2.7 eV, a barrier is formed to inhibit moving of electrons, whereby a blocking property is exhibited.

The thickness of the intermediate layer 1 was 15 nm.

Unit light-emitting layer 2: a light-emitting layer having a composition the same as that of unit light-emitting layer 1 was vapor deposited at a film thickness of 20 nm.

Intermediate layer 2: intermediate layer 2 has a composition the same as that of intermediate layer 1 and a film thickness of 15 nm.

Unit light-emitting layer 3: a light-emitting layer having a composition the same as that of unit light-emitting layer 1 was vapor deposited at a film thickness of 20 nm.

(Preparation of Comparative Organic EL Element No. 2)

Comparative organic EL element No. 2 was prepared similarly to the comparative organic EL element No. 1, except that in the light-emitting layer an electron transporting material A was used instead of CBP, and $Ir(btp)_2(acac)$ was used instead of $Ir(ppy)_3$.

(Preparation of Comparative Organic EL Element No. 2A)

Comparative organic EL element No. 2A was prepared similarly to the comparative organic EL element No. 1A, except that in the light-emitting layer an electron transporting material A was used instead of CBP, and $Ir(btp)_2(acac)$ was used instead of $Ir(ppy)_3$.

(Preparation of Organic EL Element No. 1 of the Invention)

In the process of preparing the comparative organic EL element No. 1, the light-emitting layer was divided into three unit light-emitting layers as shown below, and between the respective unit light-emitting layers, intermediate layers 1 and 2 below were disposed as electric charge blocking layers shown below. Sequentially from a hole transporting layer, a unit light-emitting layer 1/an intermediate layer 1/a unit light-emitting layer 2/an intermediate layer 2/a unit light-emitting layer 3 were disposed.

Unit light-emitting layer 1: a light-emitting layer having a composition the same as that of comparative example 1 was vapor deposited at a film thickness of 10 nm.

Intermediate Layer 1: <Example of Intermediate Layer Containing Electron Blocking Material>

A hole transporting material B that becomes an electron blocking material and $Ir(ppy)_3$ were co-deposited at a volume ratio of 95:5 to form an intermediate layer.

Since an Ea value of the hole transporting material B that becomes an electron blocking material is 2.5 eV and an Ea value of CBP that mainly transports electrons in the light-emitting layer is 2.7 eV, a barrier is formed to inhibit moving of electrons, whereby a blocking property is exhibited.

The thickness of the intermediate layer 1 was 15 nm.

Unit light-emitting layer 2: a light-emitting layer having a composition the same as that of comparative example 1 was vapor deposited at a film thickness of 20 nm.

Intermediate layer 2: intermediate layer 2 has a composition the same as that of intermediate layer and a film thickness of 15 nm.

Unit light-emitting layer 3: a light-emitting layer having a composition the same as that of comparative example 1 was vapor deposited at a film thickness of 30 nm.

2. Result of Performance Evaluation

For the obtained comparative organic EL element No. 1, 1A and the organic EL element No. 1 of the invention, the external quantum efficiency and the brightness reduction time was measured under the same conditions.

(Measuring Method for External Quantum Efficiency and the Brightness Reduction Time)

For the prepared light emitting device, a DC voltage was applied by using a source measure unit model 2400 manufactured by KEITHLEY Instruments Inc. to the light emitting element to cause it to emit light. The emission spectrum and the amount of light were measured by using a brightness photometer SR-3 manufactured by Topcon Corporation, and the external quantum efficiency was calculated based on the emission spectrum, the amount of light, and the current during measurement.

As a result, while the external quantum efficiency was 9.8% in the comparative organic EL element No. 1, and 10.4% in the comparative organic EL element No. 1A, the external quantum efficiency was 12.9% in the organic EL element No. 1 of the invention. While the brightness reduction time was 48 hours in the comparative organic EL element No. 1, and 51 hours in the comparative organic EL element No. 1A, the brightness reduction time was 79 hours in the organic EL element No. 1 of the invention. It was a quite unexpected result that high external quantum efficiency and high driving durability were exhibited even though the total thickness for the two intermediate layers and the three light-emitting layers was equal with the 90 nm thickness for the comparative organic EL device.

Example 2

1. Preparation of Organic EL Element No. 2 of the Invention

In the process of preparing the comparative organic EL element No. 1 in Example 1, the three unit light-emitting layer was changed to four unit light-emitting layers below, and between the respective unit light-emitting layers, intermediate layers 11 to 13 described below were disposed. Sequentially, from a hole transporting layer, a unit light-emitting layer 11/an intermediate layer 11/a unit light-emitting layer 12/an intermediate layer 12/a unit light-emitting layer 13/an intermediate layer 13/a unit light-emitting layer 14 were disposed.

Unit Light-emitting layers 11 to 14: a composition the same as that of the light-emitting layer of the comparative organic EL element No. 1 was vapor deposited so that the respective thickness values shown below were obtained.

Unit light-emitting layer 11: 30 nm, unit light-emitting layer 12: 20 nm, unit light-emitting layer 13: 15 nm, unit light-emitting layer 14: 10 nm Intermediate Layers 11, 12, and 13: <Example Including Hole Blocking Material>

An electron transporting material B that becomes a hole blocking material and $Ir(ppy)_3$ were co-deposited so that a volume ratio thereof was 95:5 to form an intermediate layer.

An Ip value of the electron transport material B that becomes a hole blocking material is 6.4 eV, and an Ip value of CBP that mainly transports holes in the light-emitting layer 6.1 eV; accordingly, as a barrier wall is formed to inhibit moving of holes, whereby a blocking property is exhibited.

The intermediate layers 11, 12, 13 were all formed at a film thickness of 5 nm.

That is, the light-emitting layer has a constitution finely divided into 7 layers in total including unit light emitting device 11/intermediate layer 11/unit light-emitting layer 12/intermediate layer 12/unit light-emitting layer 13/intermediate layer 13/unit light-emitting layer 14, having a total thickness of 90 nm, which is identical with the thickness of the light-emitting layer of the comparative organic EL device No. 1 in example 1.

2. Result of Performance Evaluation

For the obtained organic EL element No. 2 of the invention, the external quantum efficiency and the brightness reduction time were measured in the same manner as in Example 1.

As a result, the external quantum efficiency of the organic EL element No. 2 of the invention showed an extremely high value of 13.4%, and the brightness reduction time showed 81 hours, that is extremely long durability.

Example 3

1. Preparation of Organic EL Element No. 3 of the Invention

In the process of preparing the comparative organic electroluminescent element No. 2 in Example 1, the light-emitting layer was divided into three unit light-emitting layers as shown below, and between the respective unit light-emitting layers, intermediate layers 21 and 22 containing a material of a composition shown below and having a slower electron mobility than that of the electron transport material A of the light-emitting layer were disposed. Sequentially from a hole transport layer, a unit light-emitting layer 21/an intermediate layer 21/a unit light-emitting layer 22/an intermediate layer 22/a unit light-emitting layer 23 were disposed.

Unit light-emitting layer 21: a composition the same as that of the light-emitting layer of a comparative organic EL element No. 2 in Example 1 was vapor deposited at a thickness of 10 nm.

Intermediate Layer 21: <Example of Intermediate Layer Including CBP Having Low Electron Mobility>

CBP having low electron mobility and Ir(btp)$_2$(acac) were co-deposited so that a volume ratio thereof was 95:5 to form an intermediate layer.

The intermediate layer was formed at a film thickness of 15 nm.

Unit Light-emitting layer 22: a composition the same as that of the light-emitting layer of a comparative organic EL element No. 2 was vapor deposited at a thickness of 20 nm.

Intermediate layer 22: a composition the same as that of the intermediate layer 21, having a thickness of 15 nm.

Unit Light-emitting layer 23: a composition the same as that of the light-emitting layer of a comparative organic EL element No. 2 was vapor deposited at a thickness of 30 nm.

2. Result of Performance Evaluation

For the obtained organic EL element No. 3 of the invention, comparative organic EL element No. 2 and 2A, the external quantum efficiency and the brightness reduction time were measured in the same manner as in Example 1. As a result, while the external quantum efficiency was 4.8% in the comparative organic EL element No. 2, and 5.2% in the comparative organic EL element No. 2A, the external quantum efficiency in the organic EL element No. 3 of the invention showed an extremely high value of 6.2%. While the brightness reduction time was 65 hours in the comparative organic EL element No. 2, and 72 hours in the comparative organic EL element No. 2A, the brightness reduction time was 79 hours in the organic EL element No. 3 of the invention, that shows extremely improved long durability.

Example 4

1. Preparation of Organic EL Element No. 4 of the Invention

In the process of preparing the comparative organic EL element No. 1 in Example 1, the light-emitting layer was divided into four unit light-emitting layers as shown below, and between the respective unit light-emitting layers, intermediate layers 31 to 33 of a composition shown below and containing a material having a lower hole mobility than the CBP of the light-emitting layer were disposed. Sequentially from a hole transport layer, a unit light-emitting layer 31/an intermediate layer 31/a unit light-emitting layer 32/an intermediate layer 32/a unit light-emitting layer 33/an intermediate layer 33/a unit light-emitting layer 34 were disposed.

Unit light-emitting layers 31 to 34: a composition the same as that of the light-emitting layer of the comparative organic EL element No. 1 was vapor deposited so that the respective thickness values shown below were obtained.

Unit light-emitting layer 31: 30 nm, unit light-emitting layer 32: 20 nm, unit light-emitting layer 33: 15 nm, unit light-emitting layer 34: 10 nm Intermediate Layers 31, 32, 33: <Example Including Hole Transport Material Having Low Hole Mobility>

A hole transport material A having low hole mobility and Ir(ppy)$_3$ were co-deposited so that a volume ratio thereof was 95:5 to form an intermediate layer.

The intermediate layers 31, 32, and 33 were all formed at a film thickness of 5 nm.

That is, it has a constitution finely divided into 7 layers in total including unit light emitting layer 31/intermediate layer 31/unit light-emitting layer 32/intermediate layer 32/unit light-emitting layer 33/intermediate layer 33/unit light-emitting layer 34, having a total thickness of 90 nm, which is identical with the thickness of the light-emitting layer of the comparative organic EL device No. 1 in example 1.

2. Result of Performance Evaluation

For the obtained organic EL element No. 4 of the invention, the external quantum efficiency and the brightness reduction time were measured in the same manner as in Example 1.

As a result, the external quantum efficiency of the organic EL element No. 4 of the invention showed an extremely high value of 12.8%, and the brightness reduction time was 75 hours, that shows extremely long durability.

Chemical structures of the compounds used in Examples of the invention are shown below.

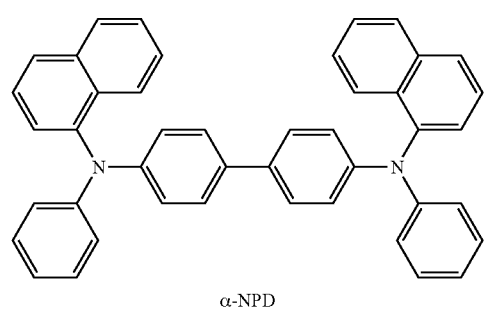

α-NPD

-continued
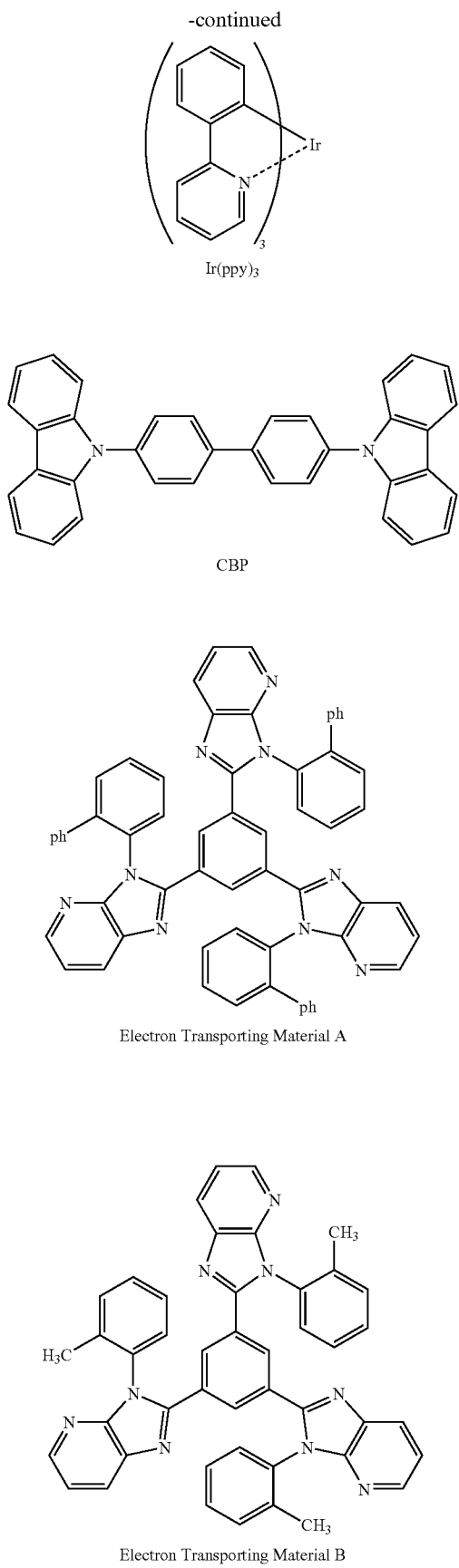
Ir(ppy)₃
CBP
Electron Transporting Material A
Electron Transporting Material B
-continued
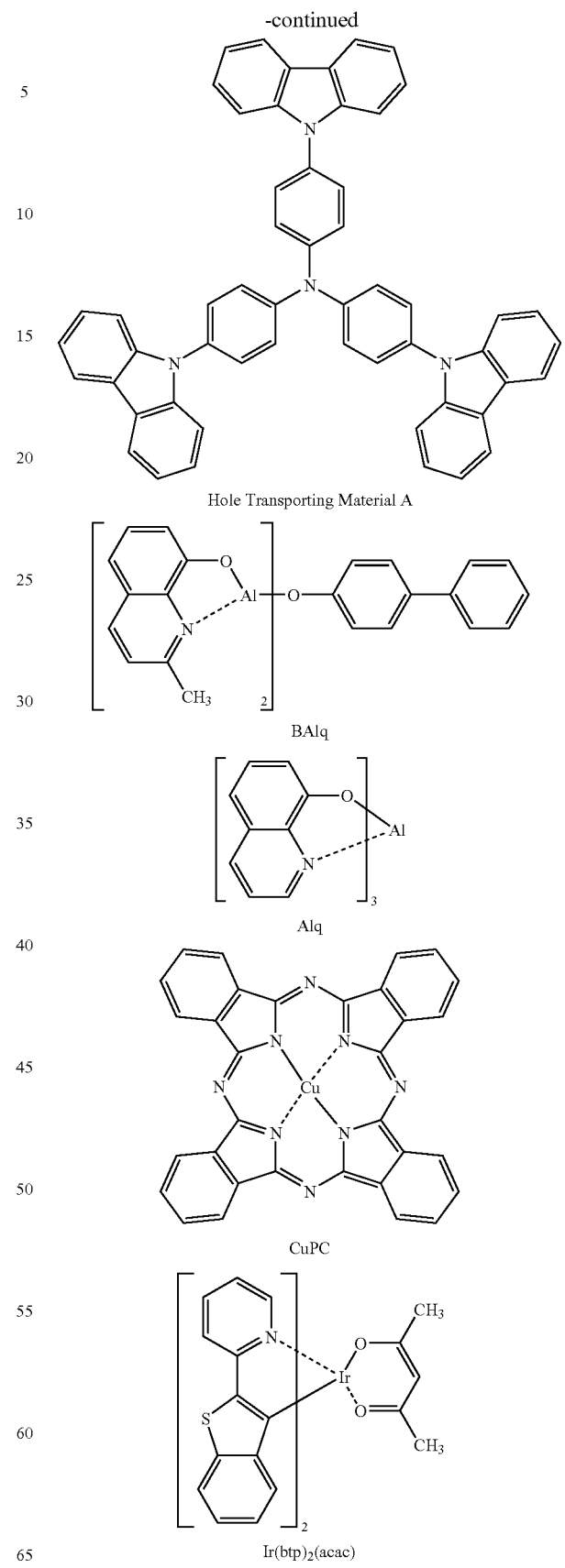
Hole Transporting Material A
BAlq
Alq
CuPC
Ir(btp)₂(acac)

DESCRIPTION OF REFERENCE NUMBERS USED IN DRAWINGS

1: anode, 2: hole injection layer, 3: hole transport layer, 4: light-emitting layer, 4a, 4b, 4c, 4d: unit light-emitting layers, 5: electron transport layer, 6: electron injection layer, 7: cathode, 8: intermediate layer, 8a, 8b, 8c: intermediate layers dividing light-emitting layer

What is claimed is:

1. An organic electroluminescent element, comprising at least a light-emitting layer interposed between a pair of electrodes, wherein;
   the light-emitting layer is divided into at least three layers in a thickness direction thereof including a light-emitting layer A close to an anode, a light-emitting layer C close to a cathode and a light-emitting layer B between the light-emitting layer A and the light-emitting layer C;
   a thickness (a) of the light-emitting layer A, a thickness (c) of the light-emitting layer C and a thickness (b) of the light-emitting layer B satisfy the relationship of $a<b<c$; and
   an intermediate layer containing an electron blocking material is disposed between the divided light-emitting layers.

2. The organic electroluminescent element according to claim 1, wherein an Ea value (electron affinity) of the electron blocking material is smaller than a smallest Ea value of materials constituting the light-emitting layers.

3. The organic electroluminescent element according to claim 1, wherein an electron mobility of the electron blocking material is slower than an electron mobility of a material in which electrons mainly flow among materials constituting the light-emitting layers.

4. The organic electroluminescent element according to claim 1, wherein a light-emitting material of the light-emitting layer is a phosphorescent material.

5. The organic electroluminescent element according to claim 1, wherein the intermediate layer contains a light-emitting material.

6. The organic electroluminescent element of claim 5, wherein the light-emitting material that the intermediate layer contains is a phosphorescent material.

7. An organic electroluminescent element, comprising at least a light-emitting layer interposed between a pair of electrodes, wherein;
   the light-emitting layer is divided into at least three layers in a thickness direction thereof including a light-emitting layer A close to an anode, a light-emitting layer C close to a cathode and a light-emitting layer B between the light-emitting layer A and the light-emitting layer C;
   a thickness (a) of the light-emitting layer A, a thickness (c) of the light-emitting layer C and a thickness (b) of the light-emitting layer B satisfy the relationship of $a>b>c$; and
   an intermediate layer containing a hole blocking material is disposed between the divided light-emitting layers.

8. The organic electroluminescent element according to claim 7, wherein an Ip value (ionization potential) of the hole blocking material is larger than a largest Ip value of materials constituting the light-emitting layers.

9. The organic electroluminescent element according to claim 7, wherein a hole mobility of the hole blocking material is slower than a hole mobility of materials in which holes mainly flow among materials constituting the light-emitting layers.

10. The organic electroluminescent element according to claim 7, wherein a light-emitting material of the light-emitting layer is a phosphorescent material.

11. The organic electroluminescent element according to claim 7, wherein the intermediate layer contains a light-emitting material.

12. The organic electroluminescent element according to claim 11, wherein the light-emitting material that the intermediate layer contains is a phosphorescent material.

* * * * *